(12) United States Patent
Ho et al.

(10) Patent No.: US 11,133,247 B2
(45) Date of Patent: Sep. 28, 2021

(54) VIAS WITH METAL CAPS FOR UNDERLYING CONDUCTIVE LINES

(71) Applicant: Taiwan Semiconductor Manufacturing Company, Ltd., Hsinchu (TW)

(72) Inventors: Chia-Wei Ho, Kaohsiung (TW); Chun-Wei Hsu, Hsinchu (TW); Chi-Hsiang Shen, Tainan (TW); Chi-Jen Liu, Taipei (TW); Yi-Sheng Lin, Taichung (TW); Yang-Chun Cheng, Hsinchu (TW); William Weilun Hong, Hsinchu (TW); Liang-Guang Chen, Hsinchu (TW); Kei-Wei Chen, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/525,186

(22) Filed: Jul. 29, 2019

(65) Prior Publication Data
US 2020/0105668 A1    Apr. 2, 2020

Related U.S. Application Data

(60) Provisional application No. 62/738,594, filed on Sep. 28, 2018.

(51) Int. Cl.
*H01L 23/522* (2006.01)
*H01L 23/528* (2006.01)
(Continued)

(52) U.S. Cl.
CPC ...... *H01L 23/5226* (2013.01); *H01L 21/0228* (2013.01); *H01L 21/0274* (2013.01);
(Continued)

(58) Field of Classification Search
CPC ... H01L 23/522; H01L 23/535; H01L 23/525; H01L 23/5228; H01L 23/5221;
(Continued)

(56) References Cited

U.S. PATENT DOCUMENTS 5,451,543 A * 9/1995 Woo .................. H01L 21/76816
257/E21.577
6,156,640 A * 12/2000 Tsai .................... H01L 21/0276
257/E21.029

(Continued)

FOREIGN PATENT DOCUMENTS

TW    201442184 A    11/2014
TW    201801185 A     1/2018

*Primary Examiner* — Chuong A Luu
(74) *Attorney, Agent, or Firm* — Slater Matsil, LLP

(57) ABSTRACT

A semiconductor device includes a first dielectric layer over a substrate, the first dielectric layer including a first dielectric material extending from a first side of the first dielectric layer distal from the substrate to a second side of the first dielectric layer opposing the first side; a second dielectric layer over the first dielectric layer; a conductive line in the first dielectric layer, the conductive line including a first conductive material, an upper surface of the conductive line being closer to the substrate than an upper surface of the first dielectric layer; a metal cap in the first dielectric layer, the metal cap being over and physically connected to the conductive line, the metal cap including a second conductive material different from the first conductive material; and a via in the second dielectric layer and physically connected to the metal cap, the via including the second conductive material.

20 Claims, 24 Drawing Sheets

(51) Int. Cl.
*H01L 21/768* (2006.01)
*H01L 21/02* (2006.01)
*H01L 23/532* (2006.01)
*H01L 21/311* (2006.01)
*H01L 21/027* (2006.01)
*H01L 21/3213* (2006.01)
*H01L 21/321* (2006.01)
*H01L 23/00* (2006.01)

(52) U.S. Cl.
CPC .. *H01L 21/31144* (2013.01); *H01L 21/32134* (2013.01); *H01L 21/7685* (2013.01); *H01L 21/76802* (2013.01); *H01L 21/76843* (2013.01); *H01L 21/76877* (2013.01); *H01L 23/5283* (2013.01); *H01L 23/53209* (2013.01); *H01L 23/53257* (2013.01); *H01L 21/3212* (2013.01); *H01L 21/7684* (2013.01); *H01L 24/03* (2013.01); *H01L 24/05* (2013.01); *H01L 24/11* (2013.01); *H01L 24/13* (2013.01); *H01L 2224/0346* (2013.01); *H01L 2224/03916* (2013.01); *H01L 2224/0401* (2013.01); *H01L 2224/05024* (2013.01); *H01L 2224/05083* (2013.01); *H01L 2224/05147* (2013.01); *H01L 2224/05155* (2013.01); *H01L 2224/05166* (2013.01); *H01L 2224/13111* (2013.01)

(58) Field of Classification Search
CPC ......... H01L 23/53295; H01L 23/53223; H01L 23/53238; H01L 23/53252; H01L 23/53266; H01L 23/5258; H01L 23/5382; H01L 21/76885; H01L 2224/221; H01L 2224/2201; H01L 2224/2205; H01L 2224/224; H01L 23/00; H01L 23/481; H01L 23/532; H01L 23/528; H01L 23/5226; H01L 23/5283; H01L 23/53209; H01L 24/05; H01L 24/03; H01L 24/11; H01L 24/13; H01L 21/02; H01L 21/768; H01L 21/7685; H01L 21/76802; H01L 21/7684; H01L 21/76877; H01L 21/76843; H01L 21/76849; H01L 21/76883; H01L 21/76898; H01L 21/0274; H01L 21/0228; H01L 21/321; H01L 21/3213; H01L 21/3212; H01L 21/32134; H01L 2224/0401; H01L 2224/05024; H01L 2224/05083; H01L 2224/03916; H01L 2224/0346; H01L 2224/05147; H01L 2224/05155; H01L 2224/05166; H01L 2224/05184; H01L 2224/05644; H01L 2224/05572; H01L 2224/05569; H01L 2224/05655; H01L 2224/05647; H01L 2224/05008; H01L 2224/05171; H01L 2224/31111; H01L 2224/13155; H01L 2224/13147; H01L 2224/13139; H01L 2224/13144; H01L 2224/13164; H01L 2224/13116; H01L 2224/13022; H01L 2224/11462; H01L 2224/11334; H01L 2224/11849
USPC ........................................ 257/751
See application file for complete search history.

(56) References Cited

U.S. PATENT DOCUMENTS

| | | | |
|---|---|---|---|
| 2004/0147100 A1* | 7/2004 | Jang ................. | H01L 21/02164 438/584 |
| 2014/0183738 A1 | 7/2014 | Jezewski et al. | |
| 2016/0079161 A1* | 3/2016 | Lin ................... | H01L 21/32134 257/774 |
| 2016/0218035 A1* | 7/2016 | Yang ................. | H01L 21/76816 |
| 2017/0256488 A1* | 9/2017 | Lee ................... | H01L 21/76813 |
| 2017/0256495 A1 | 9/2017 | Briggs et al. | |
| 2017/0278742 A1 | 9/2017 | Chen et al. | |
| 2020/0058585 A1* | 2/2020 | Xu .................... | H01L 21/31116 |

* cited by examiner

VIAS WITH METAL CAPS FOR UNDERLYING CONDUCTIVE LINES

PRIORITY CLAIM AND CROSS-REFERENCE

This patent claims priority to U.S. Provisional Application No. 62/738,594, filed on Sep. 28, 2018, which application is hereby incorporated by reference herein as if reproduced in its entirety.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area. As feature sizes continue to shrink in advanced processing technologies, new processing steps may be used to achieve performance target for the semiconductor device formed. The new processing steps may also produce new challenges for semiconductor manufacturing.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
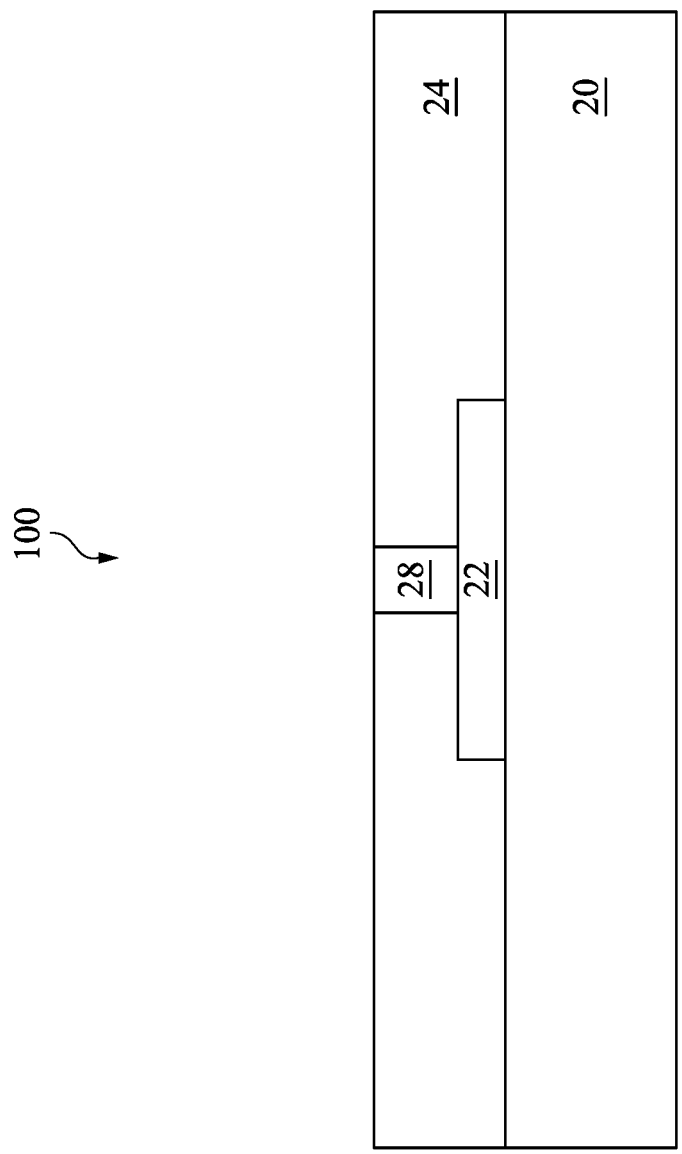
FIGS. 1-7, 8A, 8B, and 9 illustrate cross-sectional views of a semiconductor device at various stages of fabrication, in accordance with an embodiment.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments of the present disclosure are discussed in the context of semiconductor device manufacturing, and in particular, in the context of forming vias of semiconductor devices.

In some embodiments, a semiconductor device includes a metal line formed in a first dielectric layer. The metal line is formed of a first conductive material, and an upper surface of the metal line is recessed from an upper surface of the first dielectric layer. The semiconductor device also includes a metal cap over and connected to the metal line. The metal cap is formed of a second conductive material different from the first conductive material. The metal cap is wider than the metal line, and an upper surface of the metal cap is level with the upper surface of the first dielectric layer. The semiconductor device further includes a second dielectric layer over the first dielectric layer, and a via in the second dielectric layer. The via is over and connected to the metal cap. The via is formed of the second conductive material.

FIGS. 1-7, 8A, 8B, and 9 illustrate cross-sectional views of a semiconductor device 100 at various stage of fabrication, in an embodiment. The semiconductor device 100 may be a device wafer including active devices (e.g., transistors, diodes, or the like) and/or passive devices (e.g., capacitors, inductors, resistors, or the like). In some embodiments, the semiconductor device 100 is an interposer wafer, which may or may not include active devices and/or passive devices. In accordance with yet another embodiment of the present disclosure, the semiconductor device 100 is a package substrate strip, which may be package substrates with cores therein or may be core-less package substrates. In subsequent discussion, a device wafer is used as an exemplary semiconductor device 100. The teaching of the present disclosure may also be applied to interposer wafers, package substrates, or other semiconductor structures.

As illustrated in FIG. 1, the semiconductor device 100 includes a semiconductor substrate 20 and integrated circuit devices 22 (e.g., active devices, passive devices, conductive pads) formed on or in the semiconductor substrate 20. The semiconductor substrate 20 may include a semiconductor material, such as silicon, doped or undoped, or an active layer of a semiconductor-on-insulator (SOI) substrate. The semiconductor substrate 20 may include other semiconductor materials, such as germanium; a compound semiconductor including silicon carbide, gallium arsenic, gallium phosphide, gallium nitride, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used.

In the example of FIG. 1, integrated circuit devices 22 are formed on or in the semiconductor substrate 20. Exemplary integrated circuit devices 22 include transistors (e.g., Complementary Metal-Oxide Semiconductor (CMOS) transistors), resistors, capacitors, diodes, and the like. The integrated circuit devices 22 may be formed using any suitable method, details are not discussed herein.

After the integrated circuit devices 22 are formed, an Inter-Layer Dielectric (ILD) 24 is formed over the semiconductor substrate 20 and over the integrated circuit devices 22. The ILD 24 may fill spaces between gate stacks of the transistors (not individually illustrated) in the integrated circuit devices 22. In accordance with some embodiments, the ILD 24 comprises phosphosilicate glass (PSG), borosilicate glass (BSG), boron-doped phosphosilicate glass (BPSG), fluorine-doped silicate glass (FSG), tetraethyl orthosilicate (TEOS), or the like. The ILD 24 may be formed using spin coating, Flowable Chemical Vapor Deposition (FCVD), or the like. In some embodiments, the ILD 24 is formed using a suitable deposition method such as Plasma Enhanced Chemical Vapor Deposition (PECVD), Low Pressure Chemical Vapor Deposition (LPCVD), or the like.

Referring to FIG. 1, a contact plug 28 is formed in the ILD 24, and electrically couples the integrated circuit devices 22 to overlying conductive features such as metal lines, vias, and conductive pillars. In accordance with some embodiments of the present disclosure, the contact plug 28 is formed of a conductive material such as tungsten, aluminum, copper, titanium, tantalum, titanium nitride, tantalum nitride, alloys thereof, and/or multi-layers thereof. The formation of the contact plug 28 may include forming contact openings in the ILD 24, filling a conductive material(s) into the contact openings, and performing a planarization process, such as a Chemical Mechanical Polish (CMP), to level the top surface of the contact plug 28 with the top surface of the ILD 24.

Figure 2:
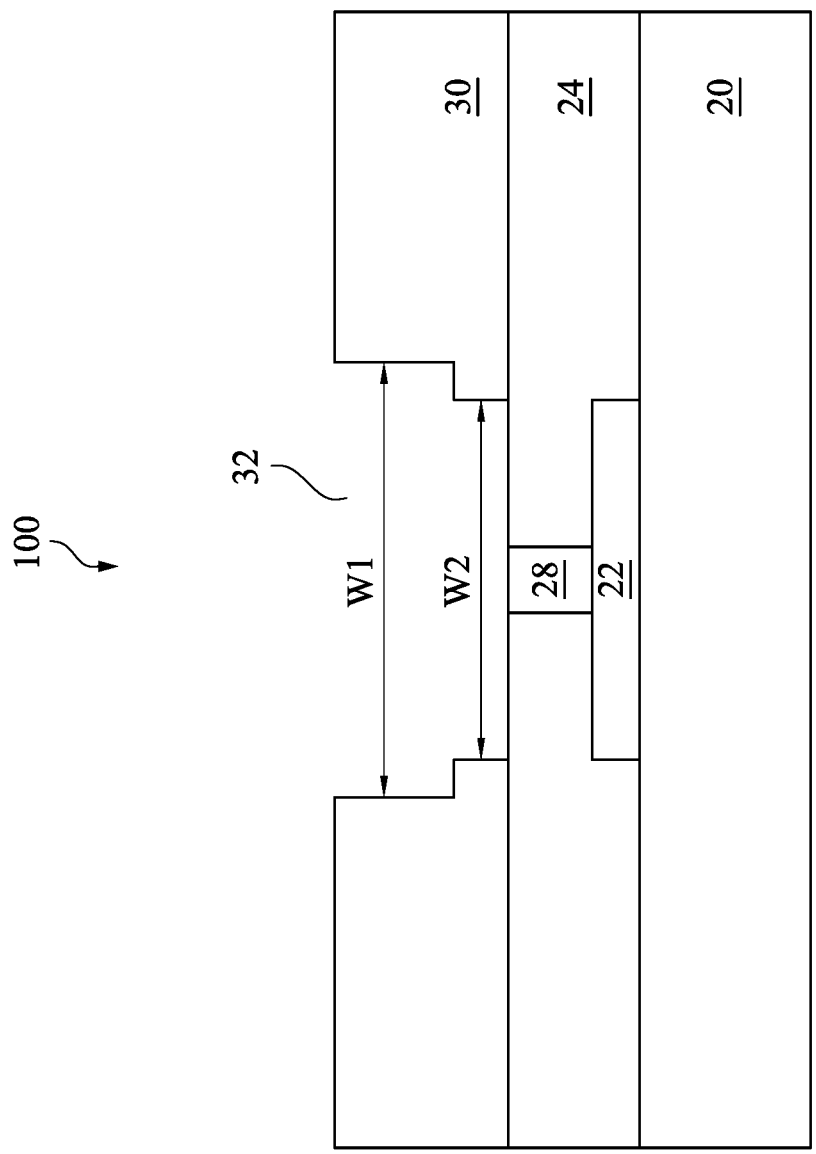

Next, in FIG. 2, an Inter-Metal Dielectric (IMD) layer 30 is formed over the ILD 24, and an opening 32 is formed in the IMD layer 30 to expose the contact plug 28. The IMD layer 30 may be formed of a dielectric material such as silicon oxide, silicon nitride, silicon carbide, silicon oxynitride, or the like. In accordance with some embodiments, the IMD layer 30 is formed of a low-k dielectric material having a dielectric constant (k-value) lower than 3.0, such as about 2.5, about 2.0, or even lower. The IMD layer 30 may comprise Black Diamond (a registered trademark of Applied Materials), a carbon-containing low-k dielectric material, Hydrogen SilsesQuioxane (HSQ), MethylSilsesQuioxane (MSQ), or the like. The formation of the IMD layer 30 may include depositing a porogen-containing dielectric material over the ILD 24, and then performing a curing process to drive out the porogen, thereby forming the IMD layer 30 that is porous, as an example. Other suitable methods may also be used to form the IMD layer 30.

The openings 32 are formed using suitable methods such as photolithography and etching techniques. In the illustrated example of FIG. 2, the opening 32 has an upper portion with a width $W_1$ and a lower portion with width $W_2$, where $W_1$ is larger than $W_2$. The openings 32 have straight sidewalls (e.g., perpendicular to the upper surface of the ILD 24) in the illustrated example. In other embodiments, the openings may have slanted sidewalls (see, e.g., openings 33 in FIG. 14), or other shapes due to the processing used to form the openings. The openings 32 may be formed by using, e.g., two separate photolithography and etching processes. For example, a first photolithography and etching process using a first mask layer may be performed to form a first opening with width $W_2$, where the first opening extends through the IMD layer 30 and exposes the contact plug 28. Next, after removing the first mask layer, a second photolithography and etching process using a second mask layer may be performed to form the upper portions of the openings 32 with width $W_1$. Other methods for forming the opening 32 are also possible and are fully intended to be included within the scope of the present disclosure.

Figure 3:
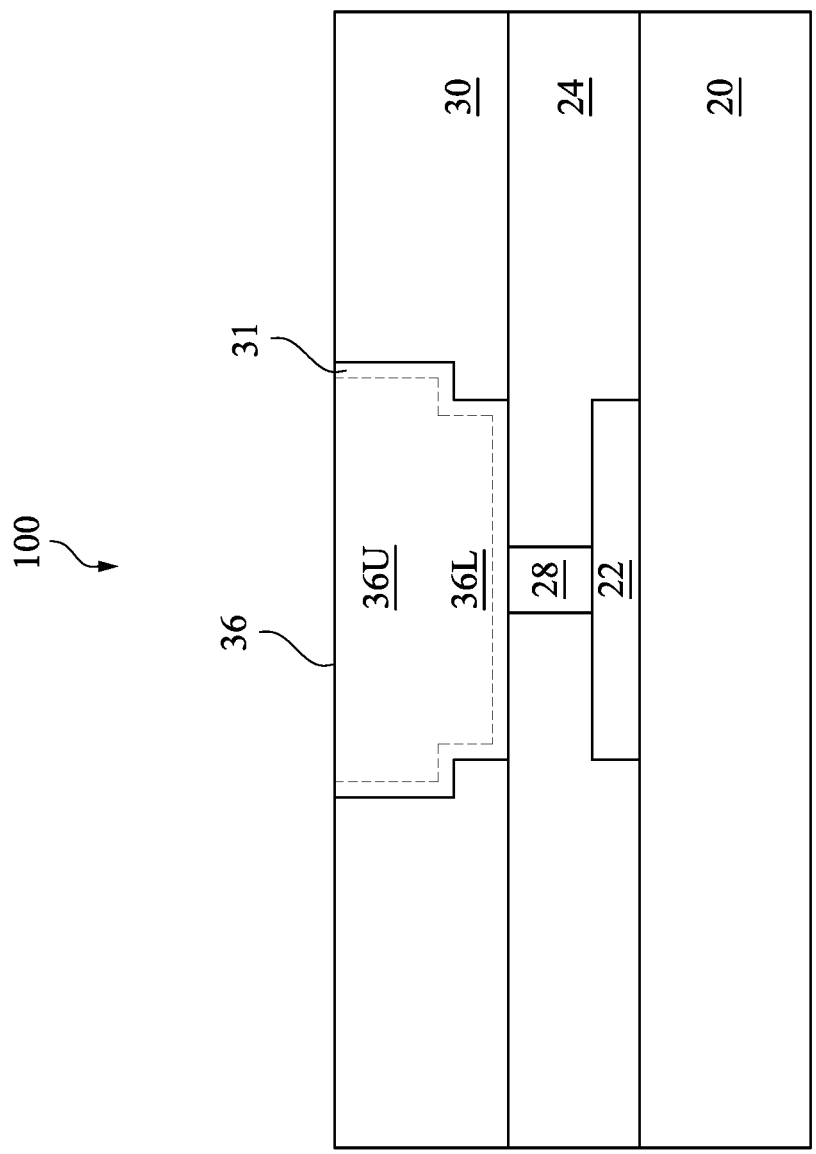

Next, as illustrated in FIG. 3, a conductive material 36 is formed to fill the openings 32 (see label in FIG. 2). The conductive material 36 may be any suitable electrically conductive material for forming, e.g., a conductive line. In an embodiment, the conductive material 36 is cobalt (Co). Other examples of the material for the conductive material 36 include W, Cu, and Ru. As illustrated in FIG. 3, a lower portion 36L of the conductive material 36 fills the lower portion of the opening 32, and an upper portion 36U of the conductive material 36 fills the upper portion of the opening 32. The conductive material 36 may be formed by chemical vapor deposition (CVD), physical vapor deposition (PVD), plating (e.g., electro-plating, or electro-less plating), or other suitable method. In some embodiments, the conductive material 36 overfills the openings 32 and covers the upper surface of the IMD layer 30, and therefore, a planarization process, such as CMP, is performed to remove excess portions of the conductive material 36 from over the upper surface of the IMD layer 30.

In some embodiments, before the conductive material 36 is formed, a barrier layer 31 (also referred to as diffusion barrier layer) is formed in the openings 32, which barrier layer 31 lines sidewalls and the bottom of the opening 32. The barrier layer 31 may include titanium, titanium nitride, tantalum, tantalum nitride, or the like, and may be formed by CVD, PVD, atomic layer deposition (ALD), or the like. In other embodiments, the barrier layer 31 is omitted. For simplicity, subsequent figures in the disclosure may not show the barrier layer 31 between the IMD layer 30 and the conductive material 36, with the understanding that barrier layer 31 may be formed between the IMD layer 30 and the conductive material 36.

Figure 4:
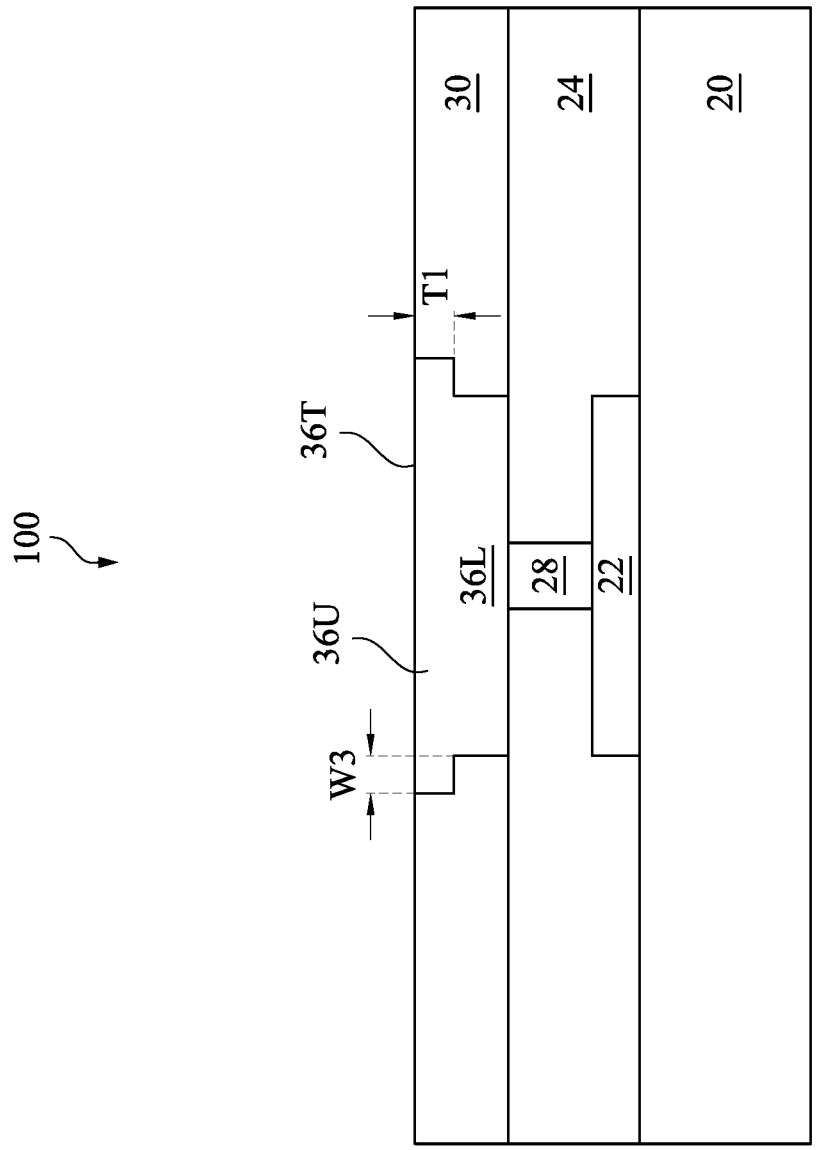

Referring next to FIG. 4, a thinning process is performed to reduce a thickness of the IMD layer 30 and to reduce a thickness of the upper portion 36U of the conductive material 36. A planarization process, such as CMP, may be used as the thinning process. The thinning process stops before reaching the lower portion 36L of the conductive material 36, as illustrated in FIG. 4. After the thinning process, a thickness $T_1$ of the remaining portion of the upper portion 36U is between about 5 nm and about 10 nm, a thickness of the IMD layer 30 is between about 0 nm and about 30 nm, and a distance $W_3$ between a sidewall of the remaining portion of the upper portion 36U and a corresponding sidewall of the lower portion 36L is between about 2 nm and about 3 nm, in the illustrated embodiment. The dimensions discussed above are non-limiting examples. Other dimensions are also possible and are fully intended to be included within the scope of the present disclosure. For example, the values for the dimensions $W_3$ and $T_1$ may change (e.g., scale) in different processing nodes.

Figure 5:
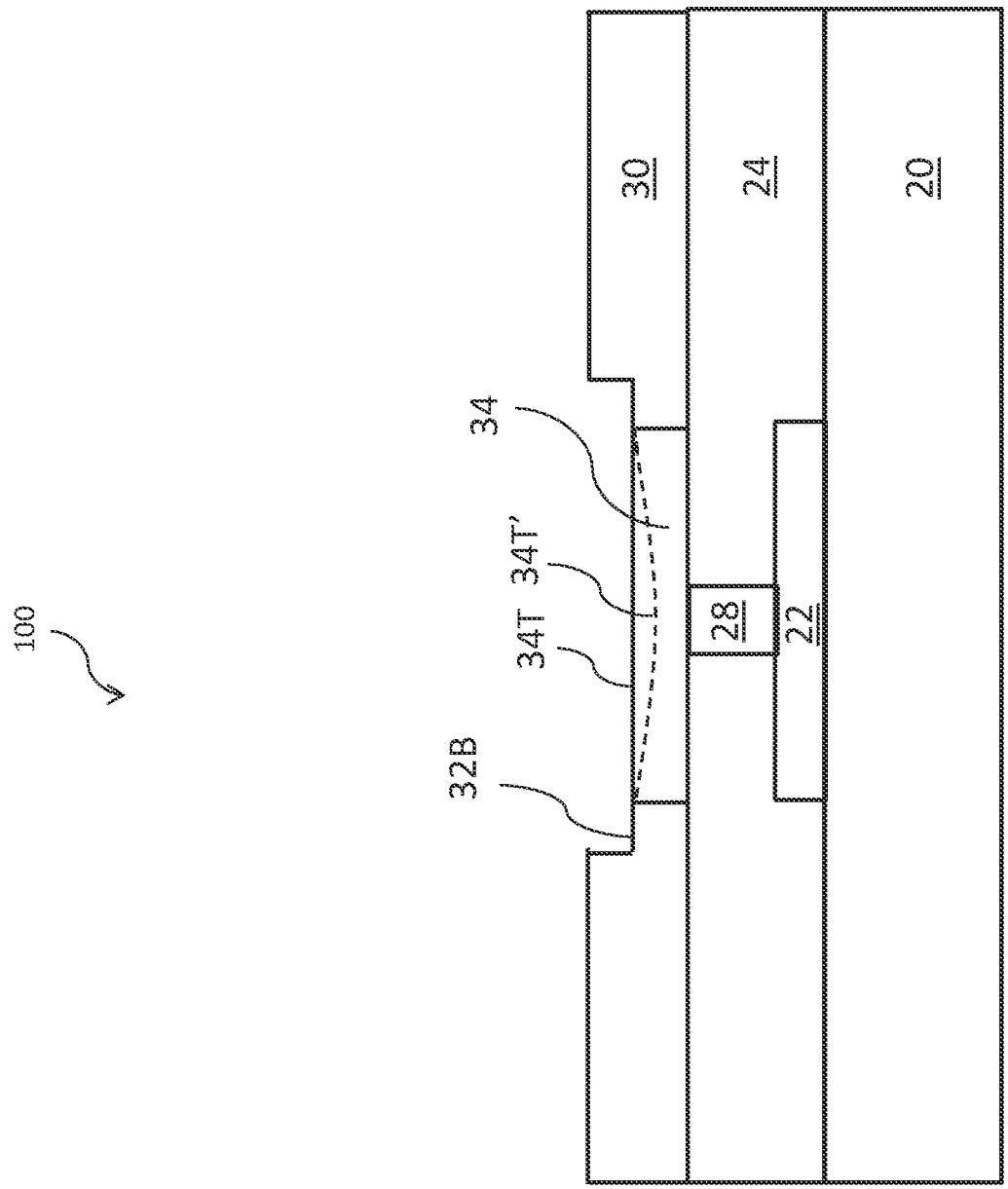

Next, in FIG. 5, the remaining portion of the upper portion 36U (see FIG. 4) is removed. In some embodiments, an etching process, such a wet etch process, is performed to remove the remaining portion of the upper portion 36U. The wet etch process may use an etchant (e.g., HF, HCl, $H_2O_2$, or KOH) that is selective to (e.g., having a higher etching rate for) the conductive material 36, such that the conductive material 36 is removed without substantially attacking the IMD layer 30. After the etching process, the remaining portion of the conductive material 36 in the lower portion of the opening 32 form a conductive line 34. The upper surface 34T of the conductive line 34 may be level with a bottom 32B of the upper portion of the opening 32. The barrier layer 31 (see FIG. 3) along sidewalls of the upper portion 36U, if formed, is also removed by the wet etch process.

In some embodiments, instead of performing a separate wet etch process, the remaining portion of the upper portion 36U (see FIG. 4) is removed by a CMP process. For example, the slurry used in the CMP process may be tuned (e.g., selected) to be selective to the conductive material 36, such that the conductive material 36 is removed at a faster rate than the IMD layer 30. After the CMP process, the remaining portion of the conductive material 36 form the conductive line 34. As illustrated in FIG. 5, due to the dishing effect of the CMP process, the upper surface 34T' (illustrated in phantom) of the conductive line 34 formed by the CMP process may be concave. For simplicity, subsequent figures in the disclosure may not show a concave upper surface 34T' for the conductive line 34, with the understanding that depending on the process used to remove the conductive material 36, the upper surface of the conductive line 34 may be flat (see, e.g., 34T) or concave (see, e.g., 34T').

Figure 6:
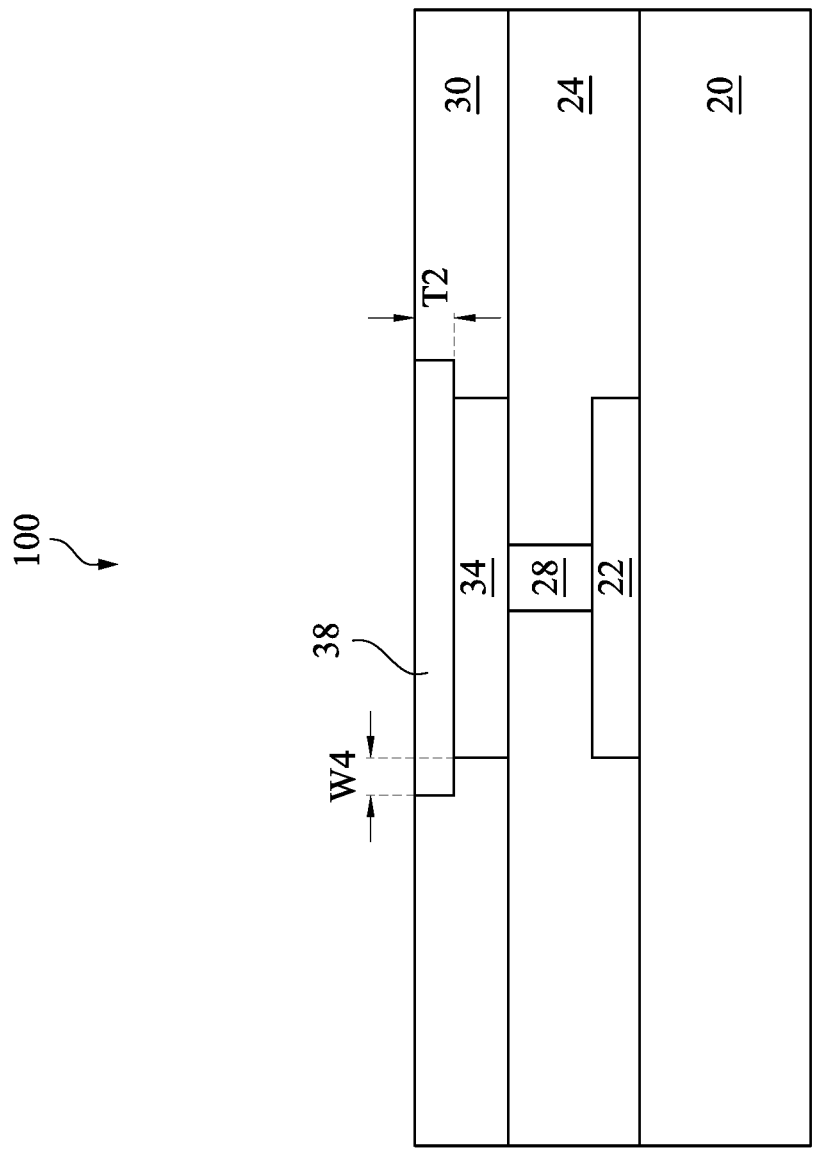

Referring next to FIG. 6, a cap 38 (may also be referred to as a metal cap) is formed over the conductive line 34 and fills the recess in the IMD layer 30, which recess is formed by the removal of the conductive material 36 (see FIG. 5). In the illustrated embodiment, the cap 38 and the conductive line 34 are formed of different materials. For example, the cap 38 is formed of a conductive material (e.g., electrically conductive material) that is different from the conductive material 36 of the conductive line 34. In an exemplary embodiment, the conductive line 34 is formed of cobalt, and the cap 38 is formed of tungsten (W). Other examples for the material of the cap 38 include Co and Ru. In the illustrated embodiment, the cap 38 is in directly contact with (e.g., physically contacts) the IMD layer 30.

The cap 38 may be formed using, e.g., CVD, PVD, plating, or other suitable method. The material of the cap 38 may overfill the recess in the IMD layer 30, in which case a planarization process, such as CMP, may be performed to remove excess portions of the material of the cap 38. In other embodiments, the material of the cap 38 is formed in the recess and fills the recess without overfilling, and therefore, the planarization process is omitted.

In some embodiments, after being formed, a thickness $T_2$ of the cap 38 is between about 5 nm and about 10 nm, and a distance $W_4$ between a sidewall of the cap 38 and a corresponding sidewall of the conductive line 34 is between about 2 nm and about 3 nm, although other dimensions are also possible. In other words, the cap 38 has a width (measured along the direction of $W_4$) larger than a width of the conductive line 34. In some embodiments, a sum of the thickness $T_2$ of the cap 38 and the thickness of the conductive line 34 is equal to the thickness of the IMD layer 30, which is between 5 nm and about 30 nm. As discussed in more details hereinafter, since the cap 38 is wider than the conductive line 34, and since the cap 38 is formed of a different material than the conductive line 34, the cap 38 is able to protect the conductive line 34 from being etched by the slurry used in a subsequent CMP process to form via 46 (see FIG. 8A), thereby reducing or preventing cavities from being formed over the conductive line 34, which cavities may result in poor electrical connection or device failure.

Figure 7:
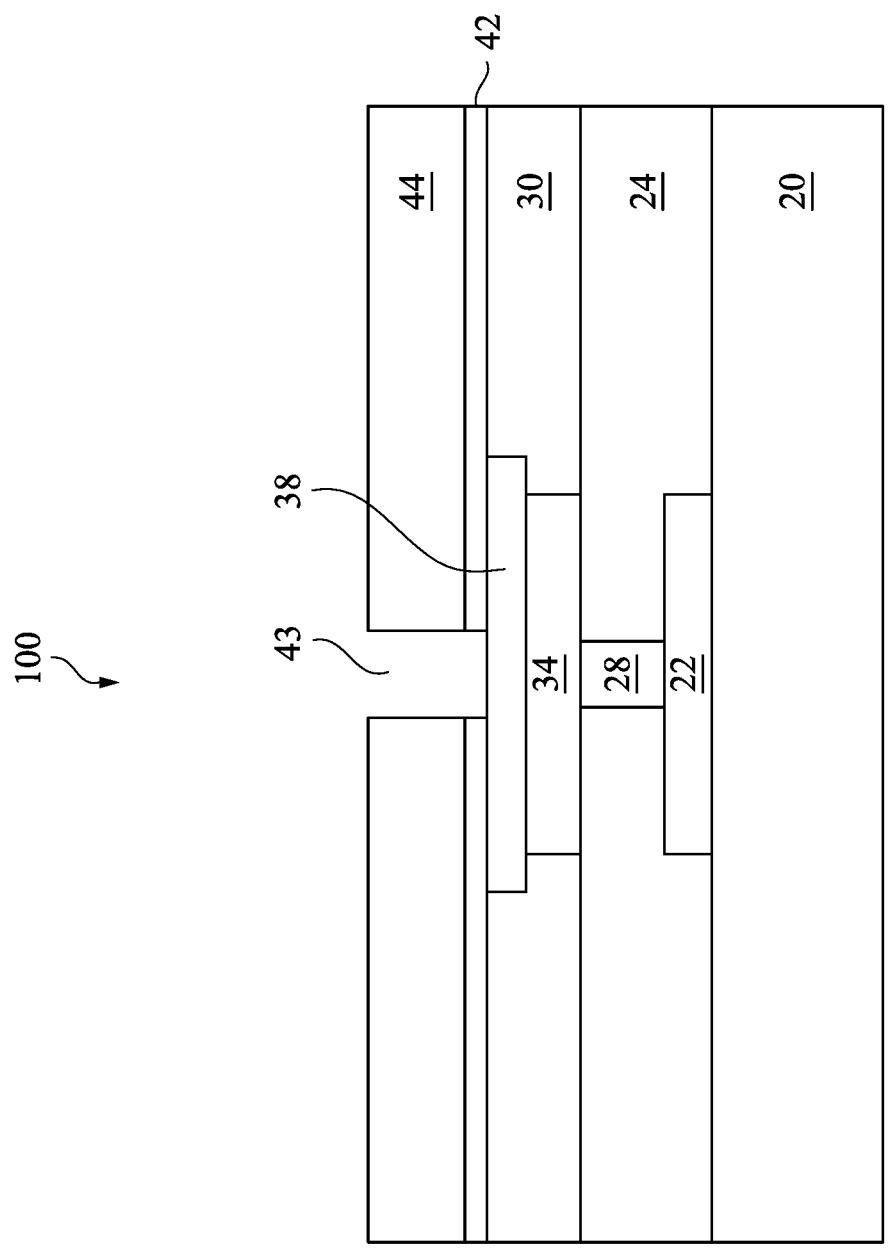

Next, in FIG. 7, an etch stop layer 42 and an IMD layer 44 are formed over the IMD layer 30 and the cap 38. The etch stop layer 42 is formed of a material that has a high etching selectivity relative to an overlying dielectric layer (e.g., 44) and may be used to control (e.g., stop) the etching process of the overlying dielectric layer. The etch stop layer 42 may be formed of silicon carbide, silicon nitride, silicon oxynitride, silicon carbo-nitride, or the like, and may be formed using a suitable deposition process such as PVD, CVD, combinations thereof, or the like. The IMD layer 44 may be formed of a dielectric material (e.g., low-k dielectric material) that is the same as or similar to the IMD layer 30, and may be formed using the same or similar method as the IMD layer 30, thus details are not repeated.

Next, a via opening 43 are formed in the IMD layer 44 using a suitable method such as photolithography and etching. The via opening 43 extends through the IMD layer 44 and the etch stop layer 42, and exposes the cap 38. In the example of FIG. 7, the via opening 43 has a width smaller than a width of the cap 38, and therefore, exposes a portion of the upper surface of the cap 38.

Figure 8A:
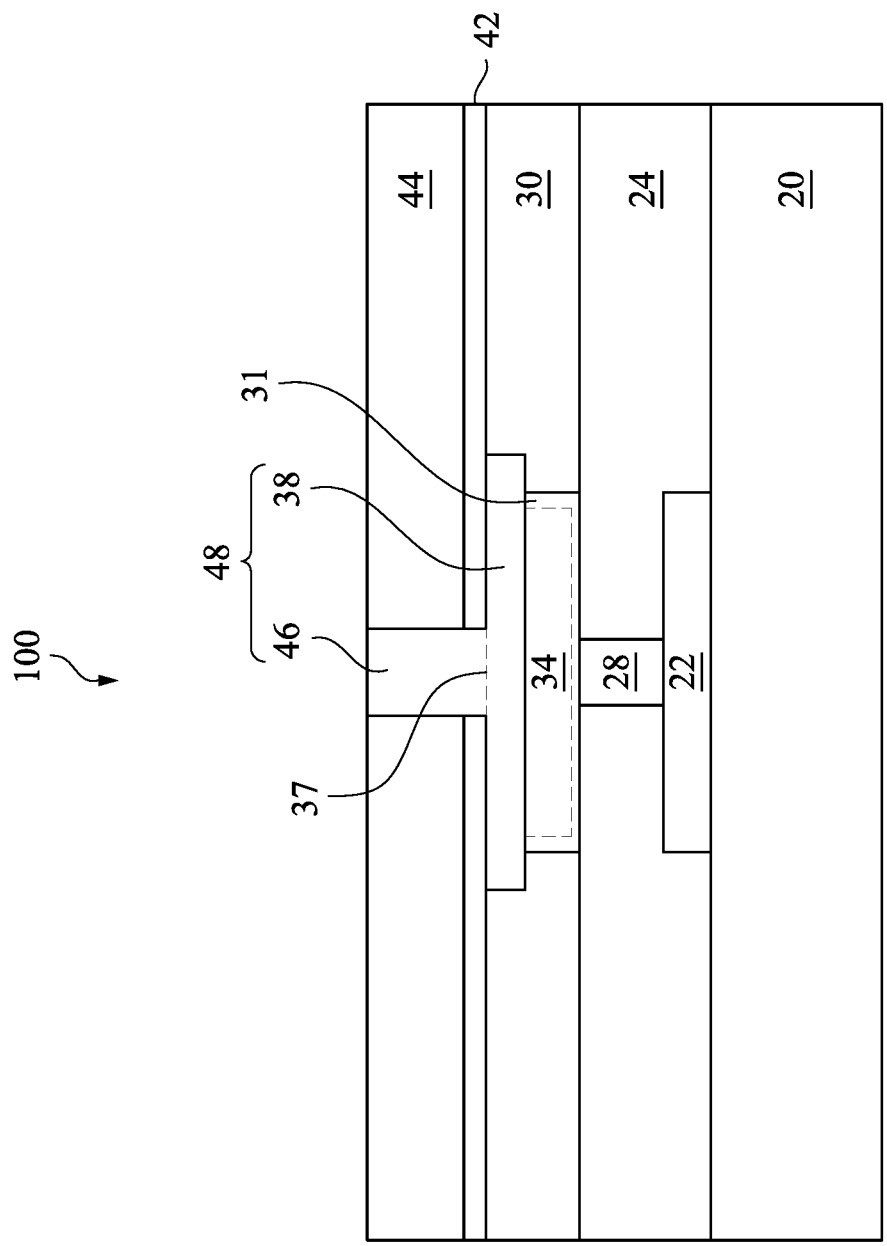

Next, in FIG. 8A, a via 46 is formed in the via opening 43 (see FIG. 7) using the conductive material (e.g., tungsten) of the cap 38. In other words, the via 46 and the cap 38 are formed of a same conductive material. The via 46 is formed directly on (e.g., in direct contact with) the cap 38. Depending on the conductive material and the process used for forming the via 46, there may or may not be an interface 37 between the via 46 and the cap 38. The via 46 and the cap 38 may be collectively referred to as a via 48, which via 48 may also be referred to as a plug, or a conductive plug. The via 46 may be referred to as the upper portion of the conductive plug 48, and the cap 38 may be referred to as the lower portion of the conductive plug 48.

The via 46 may be formed in the via opening 43 using suitable formation method such as CVD, PVD, plating, ALD, the like, or combinations thereof. A planarization process, such as CMP, may be performed to remove excess portions of the material of the via 46 from over the upper surface of the IMD layer 44.

In the illustrated embodiment, the via 46 is formed in the via opening 43 and in direct contact with the IMD layer 44, the etch stop layer 42, and the cap 38. In other words, no barrier layer is formed between the via 46 and the IMD layer 44/etch stop layer 42/cap 38. In advanced processing nodes, as the device size continues to shrink, the thickness of the barrier layer is no longer negligible compared with the dimension of the feature (e.g., the via 46) to be formed. Therefore, in the illustrated embodiment, by not having the barrier layer, the via 46 has a larger volume, and therefore, a smaller resistance, thereby reducing the resistance-capacitance delay (RC delay) of the device formed. Therefore, it may be advantageous to form the via 46 without a barrier layer to reduce the RC delay.

However, without the barrier layer, which may also act as a glue layer between the via 46 and the IMD layer 44, the adhesion between the via 46 and the IMD layer 44 may be reduced, and as a result, minute cracks may exist between the via 46 and the IMD layer 44. During the CMP process to remove excess portions of the material of the via 46, slurry used in the CMP process may seep through the minute cracks between the via 46 and the IMD layer 44 and reach the conductive line 34. If the conductive line 34 is etched by the slurry (also referred to as corrosion, or metal corrosion), cavities (e.g., recesses) may form at the upper surface of the conductive line 34, which may result in unreliable electrical connection between the via 46 and the underlying conductive line 34, and may even result in device failure.

The present disclosure prevents or reduces corrosion of the conductive line 34 by forming the cap 38, which is wider than the underlying conductive line 34 and acts as a shield for the conductive line 34. The cap 38 therefore protects (e.g., shields) the conductive line 34 from the slurry seeping down through the minute cracks between the via 46 and the IMD layer 44.

In addition, since the via 46 is formed using a conductive material (e.g., tungsten) different from the conductive material (e.g., cobalt) of the conductive line 34, the slurry used in the CMP process (e.g., to remove excessive portions of the material of the via 46) can be chosen to be selective to (e.g., having a higher etching rate for) the material of the via 46. Therefore, the slurry used for removing the material of the via 46 will not substantially attack the conductive line 34. In other words, during the CMP process for forming the via 46, the etching selectivity between the two different conductive materials of the via 46 and the conductive line 34 can be exploited to reduce or prevent corrosion of the conductive line 34. This may be achieved by choosing an acidic slurry (e.g., having a PH value smaller than 7) or an alkaline slurry (e.g., having a PH value larger than 7) that reacts with the material of the via 46 but does not react easily with the material of the conductive line 34. For example, cobalt reacts easily with an acidic slurry but does not react easily with an alkaline slurry; tungsten reacts easily with an alkaline slurry but does not react easily with an acidic slurry.

In an exemplary embodiment, the conductive line 34 is formed of cobalt, the via 46/cap 38 are formed of tungsten, and the CMP process to remove excess portions of the material of the via 46 uses an alkaline slurry, which reacts with tungsten easily but does not react easily with cobalt, thus reducing or preventing corrosion of the conductive line 34 during the CMP process. The alkaline slurry may be a slurry containing iron (Fe) ions or cobalt (Co) irons from donators such as $Fe(NO_3)_3$, $Fe(CN)_6^{3-}$, $Co(NO_3)_3$, $Co(CN)_6^{3-}$, or the like. In some embodiments, the slurry reacts with the cap 38 and forms a byproduct(s), e.g., an oxide 38A (see FIG. 8B) of the material of the cap 38 at an interface between the cap 38 and the etch stop layer 42. For simplicity, subsequent figures in the disclosure may not show the oxide 38A, with the understanding that the oxide 38A may be formed at the interface between the cap 38 and the etch stop layer 42.

Figure 8B:
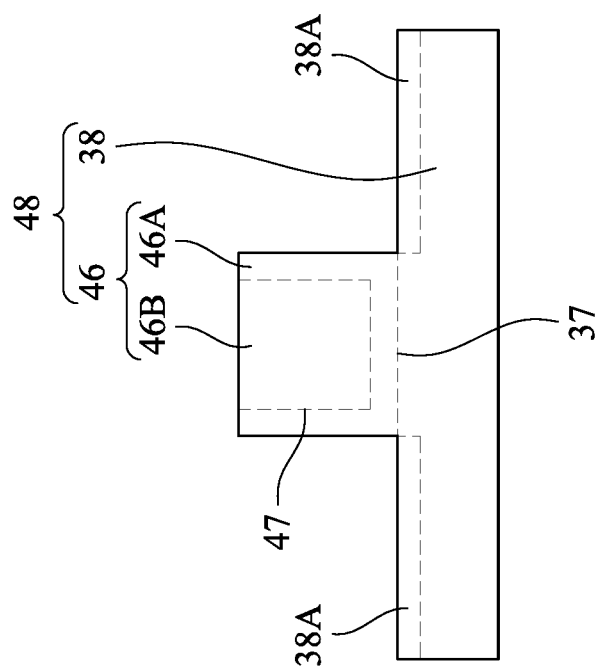

FIG. 8B illustrates a zoomed-in view of the via 48 in FIG. 8A. In some embodiments, when forming the via 46 over the cap 38, two different formation methods are used to form the via 46. In particular, an ALD deposition process is performed to form a first sublayer 46A (e.g., a conformal layer) of the via 46, and a different deposition process, such as CVD, PVD, or plating, is used to fill the rest of the via opening 43 (see FIG. 7) and to form the second sublayer 46B of the via 46. In other words, the first sublayer 46A and the second sublayer 46B are formed of a same material (e.g., tungsten), but using different deposition methods. There may be an interface 47 between the first sublayer 46A and the second sublayer 46B. The first sublayer 46A may have a thickness between about 0 nm and about 3 nm. Since the first sublayer 46A is formed by ALD, its density is higher than the second sublayer 46B. In some embodiments, having the first sublayer 46A with a higher quality (e.g., higher density) reduces the resistance of the via 46 formed. Since the deposition rate of the ALD deposition process may be lower than that of, e.g., PVD, CVD, or plating, forming the second sublayer 46B by PVD, CVD, or plating may advantageously reduce the manufacturing time. Therefore, two dual-sublayer structure of the via 46 allows for a balance to be achieved between reducing resistance (e.g., RC delay) of the via 46 and reducing the manufacturing time.

In some embodiments, the overall density (e.g., average density) of the via 46 is higher than that of the cap 38, because the via 46 has the first sublayer 46A formed of ALD (e.g., a higher density material), and the cap 38 is formed by CVD, PVD, or plating (e.g., a lower density material). In other embodiments, the via 46 does not have a plurality of sublayers, and instead, the via 46 is formed using a single deposition process such as CVD, PVD, plating, or the like, in which case the via 46 and the cap 38 may have a same density.

Figure 9:
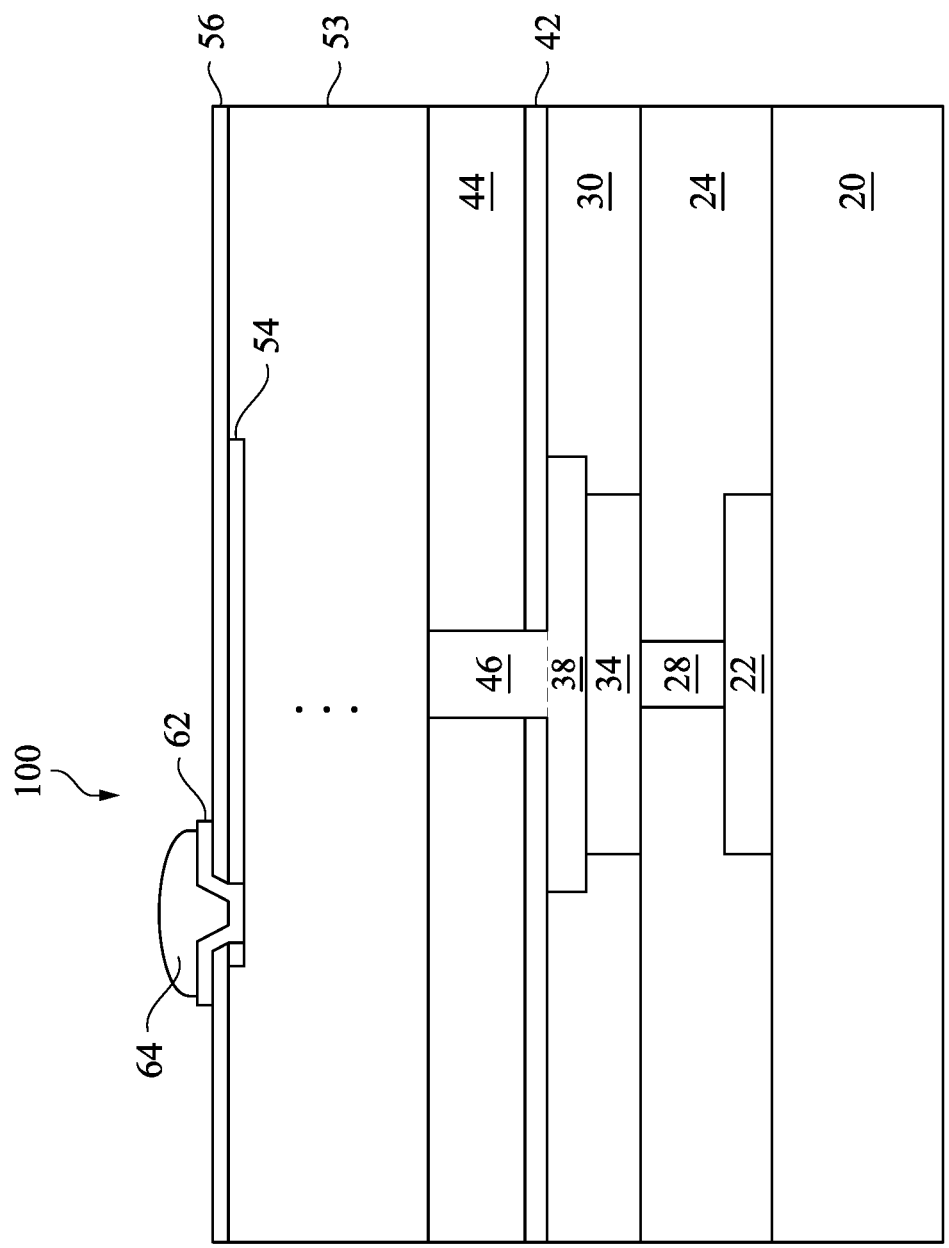

Next, in FIG. 9, one or more IMD layers 53 comprising conductive features (e.g., conductive lines and vias) are formed over the IMD layer 44, using methods same as or similar to those discussed above for forming the IMD layer (e.g., 30, or 44) and the conductive features (e.g., 34, 38, 46). Next, a passivation layer 56, such as a polymer layer, is formed over the IMD layer 53. After the passivation layer 56 is formed, an under bump metallurgy (UBM) structure 62 is formed over the passivation layer 56 and is electrically coupled to a conductive feature 54 (e.g., a conductive line) of the IMD layer 53.

In an embodiment, the UBM structure 62 comprises three layers of conductive materials, such as a layer of titanium, a layer of copper, and a layer of nickel. However, there are many suitable arrangements of materials and layers, such as an arrangement of chrome/chrome-copper alloy/copper/gold, an arrangement of titanium/titanium tungsten/copper, or an arrangement of copper/nickel/gold, that are suitable for the formation of the UBM structure 62. Any suitable materials or layers of material that may be used for the UBM structure 62 are fully intended to be included within the scope of the present disclosure.

The UBM structure 62 may be formed by: forming an opening in the passivation layer 56 to expose the conductive features 54 in the IMD layer 53; forming a seed layer over the passivation layer 56 and along the interior of the opening in the passivation layer; forming a patterned mask layer (e.g., photoresist) over the seed layer; forming (e.g., by plating) the conductive material(s) in the openings of the patterned mask layer and over the seed layer; removing the mask layer and remove portions of the seed layer on which the conductive material(s) is not formed. Other methods for forming the UBM structure 62 are possible and are fully intended to be included within the scope of the present disclosure.

Still referring to FIG. 9, next, an external connector 64 is formed on the UBM structure 62. In an embodiment, the external connectors 64 is a contact bump such as a controlled collapse chip connection (C4) bump and comprises a material such as tin, or other suitable materials, such as silver or copper. In an embodiment in which the external connectors 64 is a tin solder bump, the external connectors 64 may be formed by initially forming a layer of tin through any suitable method such as evaporation, electroplating, printing, solder transfer, ball placement, or the like. Once a layer of tin has been formed on the structure, a reflow is performed in order to shape the material into the bump shape with a diameter, e.g., of about 80 μm.

However, while the external connectors 64 has been described above as C4 bumps, these are merely intended to be illustrative and are not intended to limit the embodiments. Rather, any suitable type of external contacts, such as ball grid arrays (BGAs), microbumps, copper pillars, a copper layer, a nickel layer, a lead free (LF) layer, an electroless nickel electroless palladium immersion gold (ENEPIG) layer, a Cu/LF layer, a Sn/Ag layer, a Sn/Pb, combinations of these, or the like, may alternatively be utilized. Any suitable external connector, and any suitable process for forming the external connectors, may be utilized for the external connectors 64, and all such external connectors are fully intended to be included within the scope of the embodiments.

Figure 10:
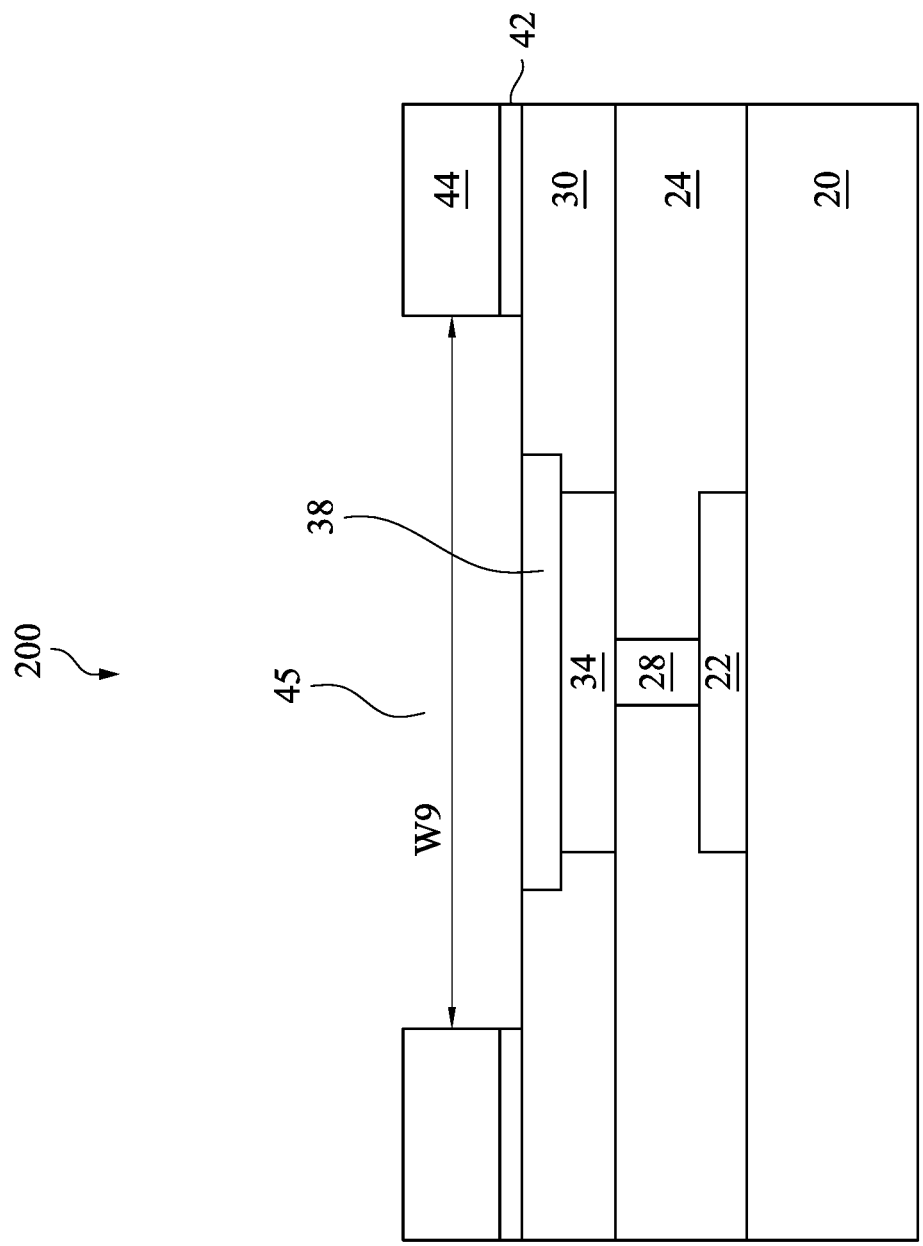
FIGS. 10-12 illustrate cross-sectional views of a semiconductor device at various stages of fabrication, in accordance with an embodiment.
Figure 11:
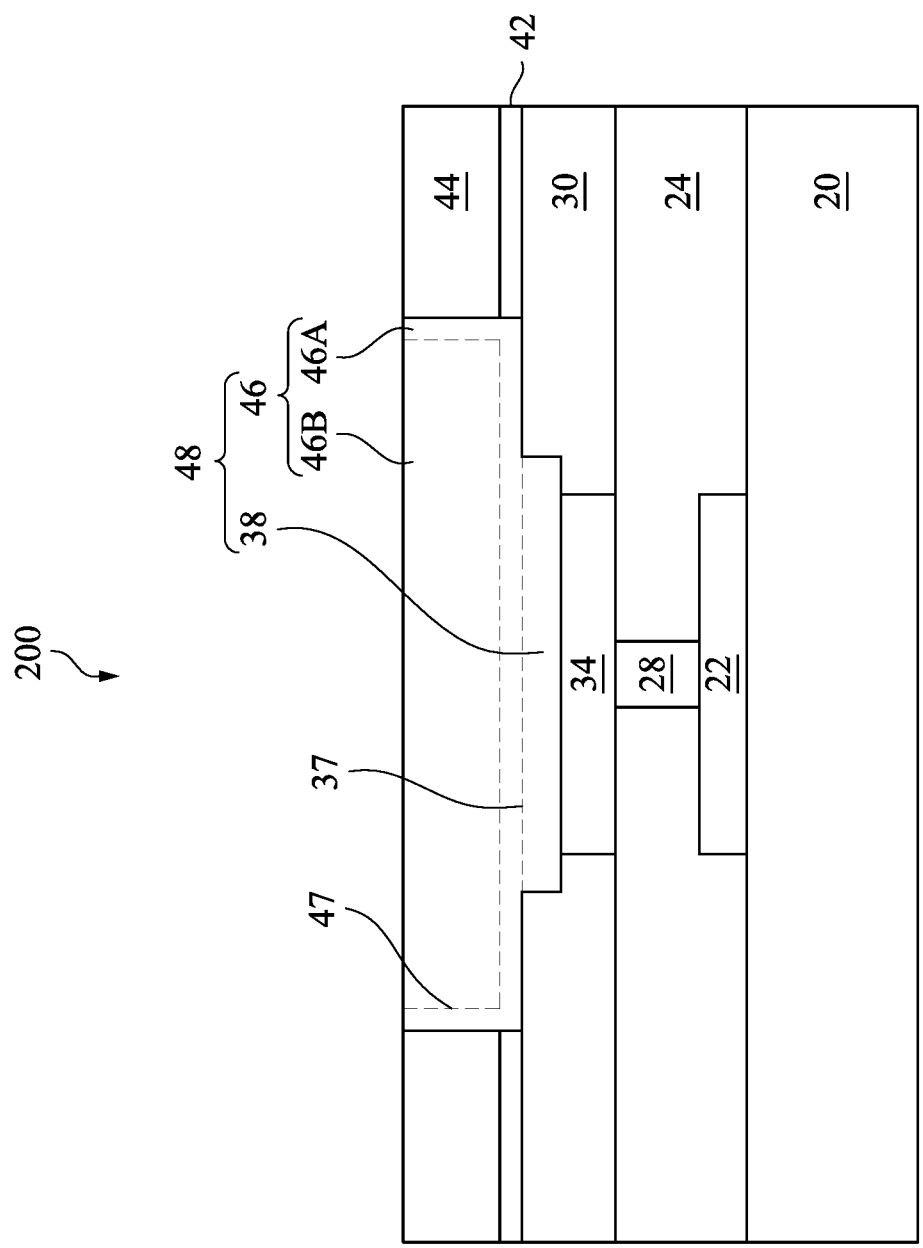
Figure 12:
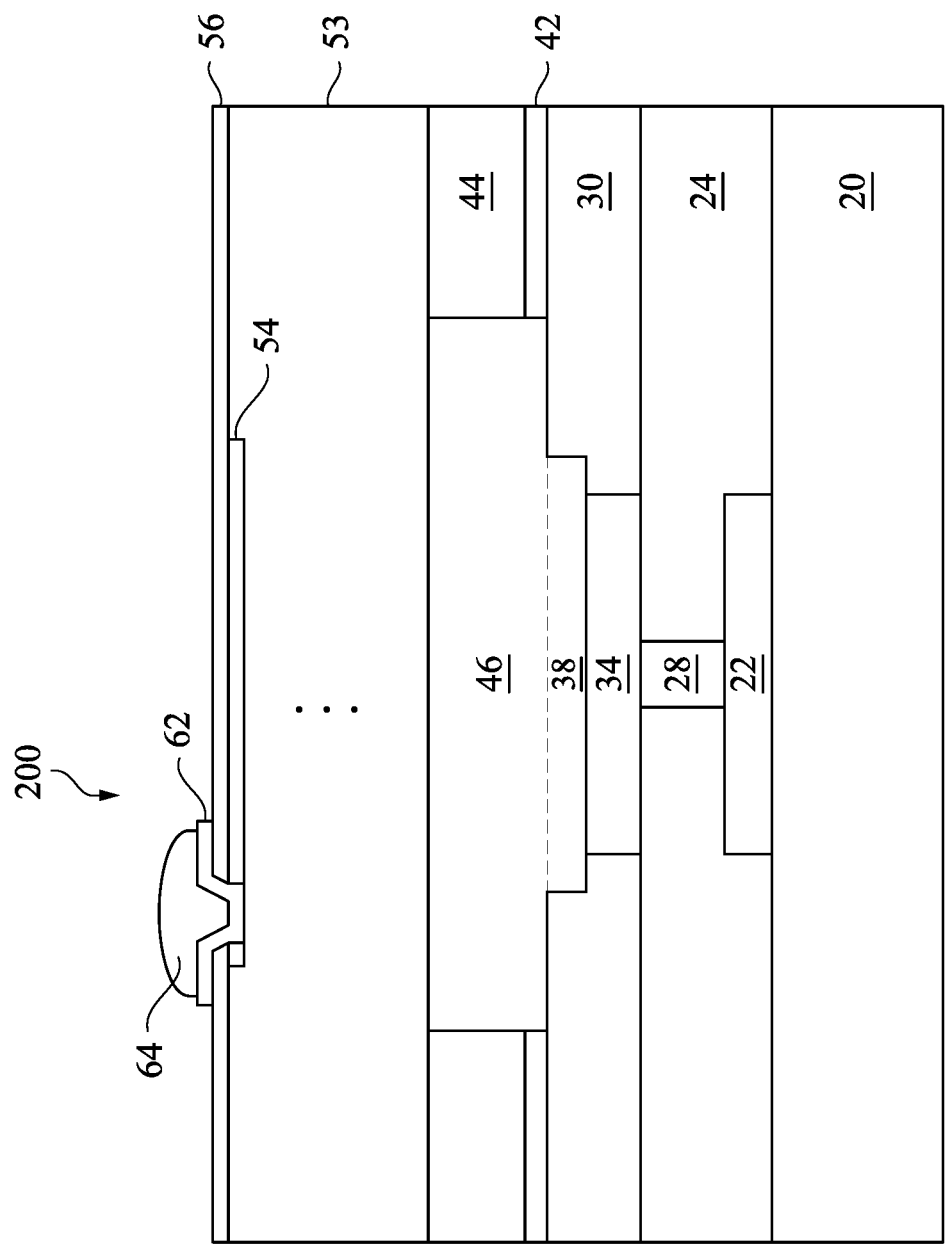

FIGS. 10-12 illustrates cross-sectional views of a semiconductor device 200 at various stages of fabrication, in an embodiment. Unless otherwise stated, same numerals in FIGS. 10-12 refer to the same or similar elements as in FIGS. 1-9 formed by a same or similar formation methods, thus details may not be repeated. The processing in FIG. 10 follows the processing illustrated in FIG. 6, and therefore, FIGS. 1-6 and 10-12 illustrate another embodiment of the present disclosure.

Referring to FIG. 10, following the processing step illustrated in FIG. 6, the etch stop layer 42 and the IMD layer 44 are formed over the IMD layer 30 and the cap 38. Next, a via opening 45 is formed in the IMD layer 44 using a suitable method such as photolithography and etching. The via opening 45 extends through the IMD layer 44 and the etch stop layer 42, and exposes the cap 38. In the example of FIG. 10, the via opening 45 has a width $W_9$ larger than a width of the cap 38, and therefore, exposes the upper surface of the cap 38 and portions of the upper surface of the IMD layer 30. In some embodiments, the width $W_9$ is between about 15 nm and about 40 nm.

Next, in FIG. 11, a via 46 is formed in the via opening 45 (see FIG. 10) using the conductive material (e.g., tungsten) of the cap 38. In other words, the via 46 and the cap 38 are formed of a same conductive material. The via 46 is formed directly on (e.g., in direct contact with) the cap 38. Depending on the conductive material and the process used for forming the via 46, there may or may not be an interface 37 between the via 46 and the cap 38. The via 46 and the cap 38 may be collectively referred to as a via 48, which via 48 may also be referred to as a plug, or a conductive plug. The via 46 may be referred to as the upper portion of the conductive plug 48, and the cap 38 may be referred to as the lower portion of the conductive plug 48.

The via 46 may be formed in the via opening 43 using suitable formation method such as CVD, PVD, plating, ALD, the like, or combinations thereof. A planarization process, such as CMP, may be performed to remove excess portions of the material of the via 46 from over the upper surface of the IMD layer 44.

In the illustrated embodiment, the via 46 is formed in the via opening 45 and in direct contact with the IMD layer 44, the etch stop layer 42, the IMD layer 30, and the cap 38. In other words, no barrier layer is formed between the via 46 and the IMD layer 44/IMD layer 30/etch stop layer 42, which may advantageously reduce the RC delay of the semiconductor device 200 formed. In some embodiments, when forming the via 46 over the cap 38, two different formation methods are used to form the via 46. In particular, an ALD deposition process is performed to form a first sublayer 46A of the via 46, and a different deposition process, such as CVD, PVD, or plating, is used to fill the rest of the via opening 45 (see FIG. 10) and to form the second sublayer 46B of the via 46. In other words, the first sublayer 46A and the second sublayer 46B are formed of a same material (e.g., tungsten) but using different deposition methods. There may be an interface 47 between the first sublayer 46A and the second sublayer 46B. The first sublayer 46A may have a thickness between about 0 nm and about 3 nm. Since the first sublayer 46A is formed by ALD, its density is higher than the second sublayer 46B. In some embodiments, having the first sublayer 46A with a higher quality (e.g., higher density) reduces the resistance of the via 46 formed. Since the deposition rate of the ALD deposition process may be lower than that of, e.g., PVD, CVD, or plating, forming the second sublayer 46B by PVD, CVD, or plating may advantageously reduce the manufacturing time, thus allowing for a balance to be achieved between reducing resistance (e.g., RC delay) of the via 46 and reducing the manufacturing time.

In some embodiments, the overall density (e.g., average density) of the via 46 is higher than that of the cap 38, because the via 46 has the first sublayer 46A formed of ALD (e.g., a higher density material), and the cap 38 is formed by CVD, PVD, or plating (e.g., a lower density material). In other embodiments, the via 46 does not have a plurality of sublayers, and instead, the via 46 is formed using a single deposition process such as CVD, PVD, plating, or the like, in which case the via 46 and the cap 38 may have a same density.

Next, in FIG. 12, one or more IMD layers 53 comprising conductive features (e.g., conductive lines and vias) are formed over the IMD layer 44, using methods same as or similar to those discussed above for forming the IMD layer (e.g., 30, or 44) and the conductive features (e.g., 34, 38, 46). Next, a passivation layer 56, such as a polymer layer, is formed over the IMD layer 53. After the passivation layer 56 is formed, an under bump metallurgy (UBM) structure 62 is formed over the passivation layer 56 and is electrically coupled to a conductive feature 54 (e.g., a conductive line) of the IMD layer 53. Next, an external connector 64 is formed on the UBM structure 62. Formation of the UBM structure 62 and the external connector 64 may be the same or similar as those described above with reference to FIG. 9, thus details are not repeated.

FIGS. 13-21 illustrates cross-sectional views of a semiconductor device 300 at various stages of fabrication, in an embodiment. Unless otherwise stated, same numerals in FIGS. 13-21 refer to the same or similar elements as in FIGS. 1-9 formed by a same or similar formation methods, thus details may not be repeated. The processing in FIG. 13 follows the processing illustrated in FIG. 1, and therefore, FIGS. 1 and 13-21 illustrate another embodiment of the present disclosure.

Figure 13:
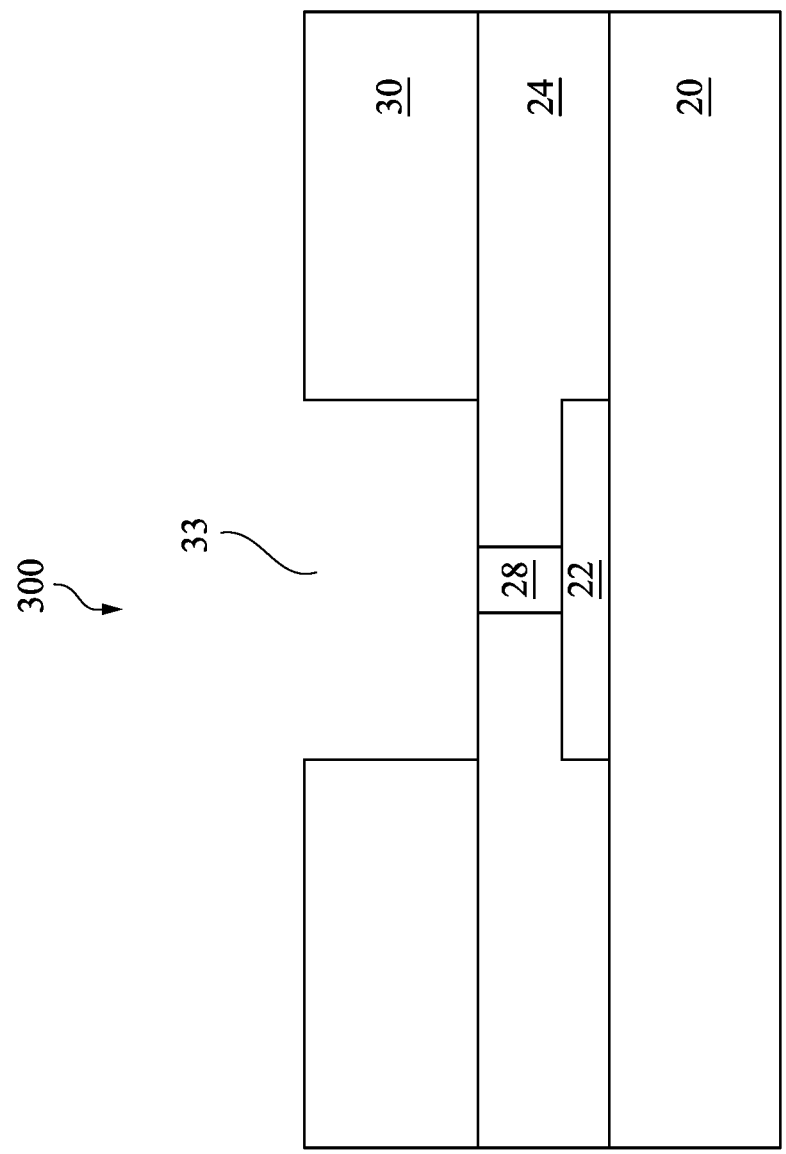
FIGS. 13-19, 20A, 20B, and 21 illustrate cross-sectional views of a semiconductor device at various stages of fabrication, in accordance with an embodiment.

Referring to FIG. 13, an IMD layer 30 is formed over the ILD 24 and over the contact plug 28. An opening 33 is formed in the IMD layer 30 to expose the underlying contact plug 28 using suitable methods such as photolithography and etching. The etching may be anisotropic such that sidewalls of the opening 33 are perpendicular to the upper surface of the ILD 24.

Figure 14:
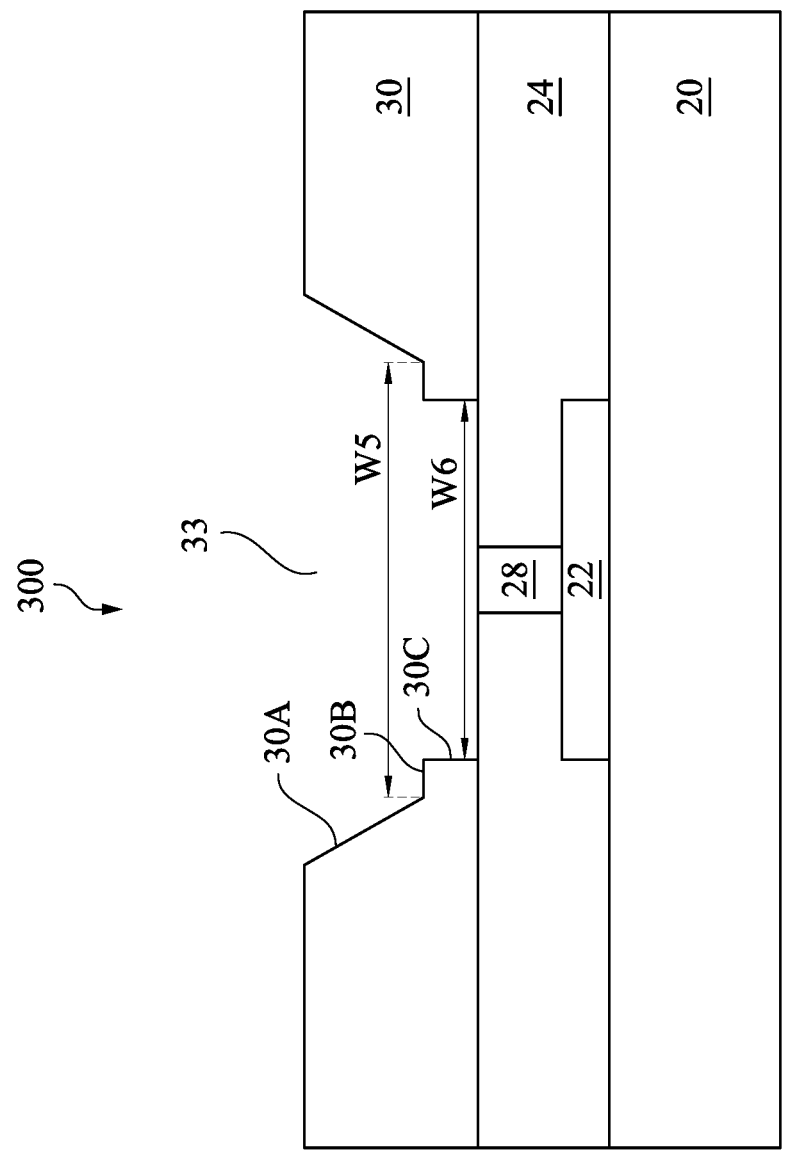

Next, in FIG. 14, the profile (e.g., shape of the sidewalls) of the opening 33 is changed by an etching process such as a dry etch process. In some embodiments, the width of an upper portion of the opening 33 is expanded by another photolithography and etching process, then a mask layer, such as photoresist, is formed at a bottom portion of the opening 33. A dry etch process is then performed to change the profile of the upper portion of the opening 33. In some embodiments, the profile of the upper portion of the opening 33 is changed using a plasma process. The plasma process may use a gas source comprising argon. The gas source comprising argon is activated into plasma, and the plasma of argon bombards the IMD layer 30 and changes the profile of the opening 33. In some embodiments, the plasma process is performed with an RF power between about 200 watt and about 600 watt, at a temperature between about 25° C. and about 80° C., and a pressure between about 0.002 torr and about 0.05 torr. A flow rate of the argon is between about 2 standard cubic centimeters per minute (sccm) and about 20 sccm. In some embodiments, the RF power of the plasma process is tuned to change a lateral etching rate of the plasma process, such that the lateral etching rate decreases along a direction from the upper surface of the IMD layer 30 toward the lower surface of the IMD layer 30, thereby forming sloped sidewalls for the upper portion of the opening 33. After the plasma process is finished, the mask layer is removed from the bottom portion of the opening 33, such that the bottom portion of the opening 33 still has vertical sidewalls.

After the etching process is finished, the upper portion of the opening 33 has sloped sidewalls 30A, and the lower portion of the opening 33 has straight (e.g., perpendicular to the upper surface of the ILD 24) sidewalls 30C. As illustrated in FIG. 14, a distance between opposing sidewalls 30A decreases as the opening 33 extends into the IMD layer 30. In addition, sidewalls 30B, which are parallel to the upper surface of the ILD 24, provide a transition between the sloping sidewalls 30A and the straight sidewalls 30C. Therefore, the shape of the sidewalls of the opening 33 include a step shape (also referred to as a stair shape). In FIG. 14, a distance $W_5$ between the sloped sidewalls 30A, measured at the bottom of the sloped sidewalls 30A, is larger than a distance $W_6$ between the straight sidewalls 30C. The distance $W_5$ may be between about 20 nm and about 40 nm, and the distance $W_6$ may be between about 15 nm and about 35 nm.

Figure 15:
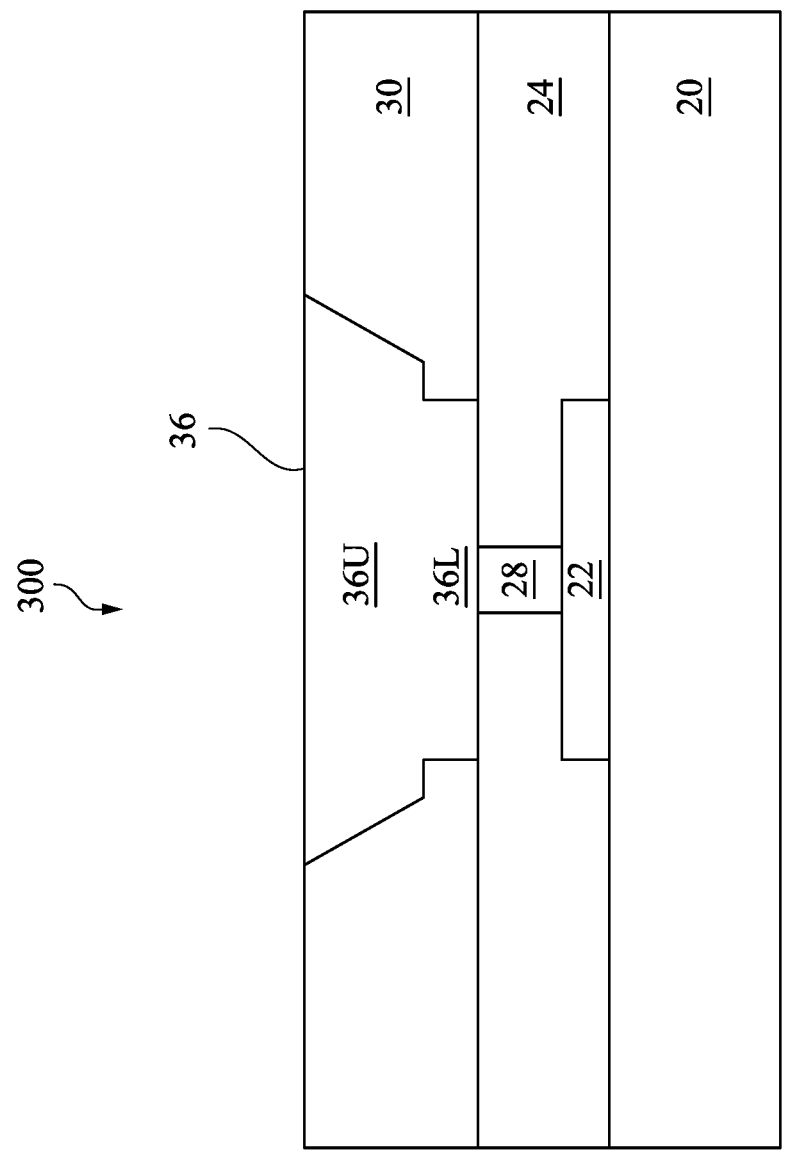

Next, in FIG. 15, a conductive material 36, such as cobalt, is formed in the opening 33. As illustrated in FIG. 15, a lower portion 36L of the conductive material 36 fill the lower portion of the opening 33, and an upper portion 36U of the conductive material 36 fills the upper portion of the opening 33. In some embodiments, the conductive material 36 overfills the opening 33 and covers the upper surface of the IMD layer 30. A planarization process, such as CMP, is then performed to remove excess portions of the conductive material 36 from over the upper surface of the IMD layer 30.

In some embodiments, before the conductive material 36 is formed, a barrier layer is formed in the opening 33, which barrier layer lines sidewalls and the bottom of the opening 33. An example of the barrier layer is illustrated in FIG. 3. For simplicity, the barrier layer is not illustrated here. In other embodiments, the barrier layer is omitted.

Figure 16:
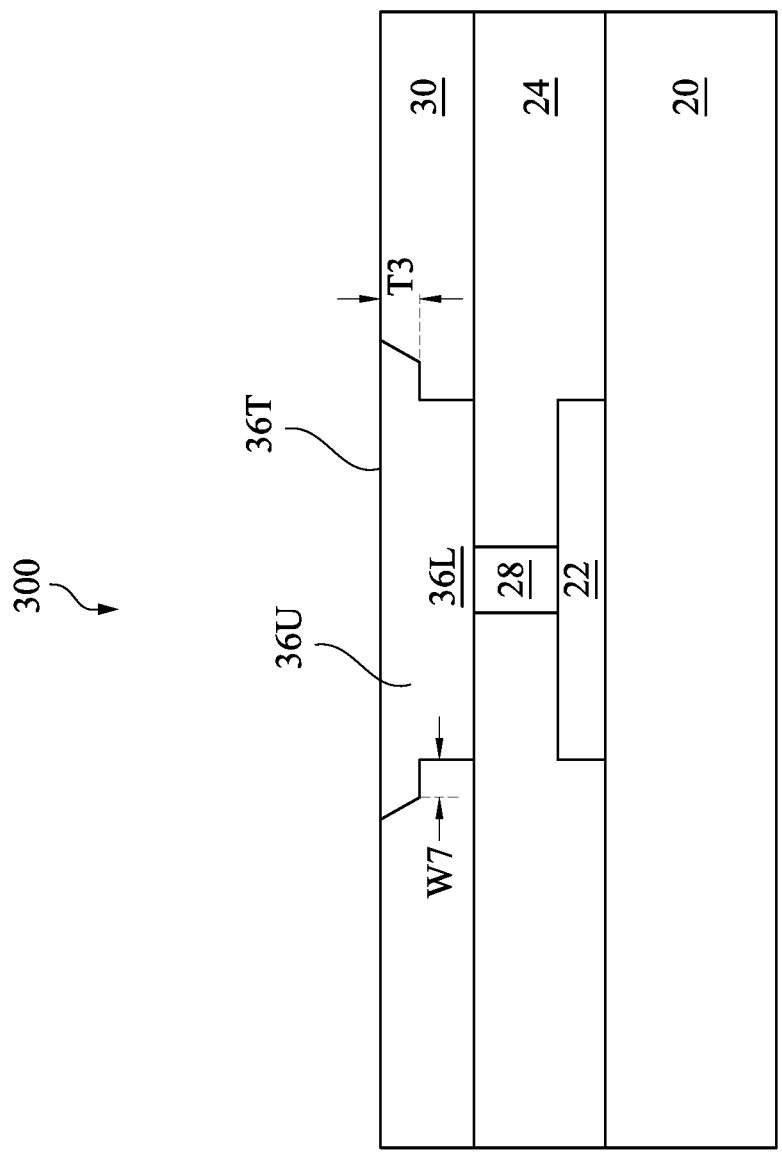

Next, in FIG. 16, a thinning process is performed to reduce a thickness of the IMD layer 30 and to reduce a thickness of the upper portion 36U of the conductive material 36. A planarization process, such as CMP, may be used as the thinning process. The thinning process stops before reaching the lower portion 36L of the conductive material 36, as illustrated in FIG. 16. After the thinning process, a thickness $T_3$ of the remaining portion of the upper portion 36U is between about 5 nm and about 10 nm, and a distance $W_7$ between a sidewall of the remaining portion of the upper portion 36U and a corresponding sidewall of the lower portion 36L is between about 2 nm and about 3 nm, in the illustrated embodiment. A thickness of the IMD layer 30 may be between about 0 nm and about 30 nm. The dimensions discussed above are non-limiting examples. Other dimensions are also possible and are fully intended to be included within the scope of the present disclosure.

Figure 17:
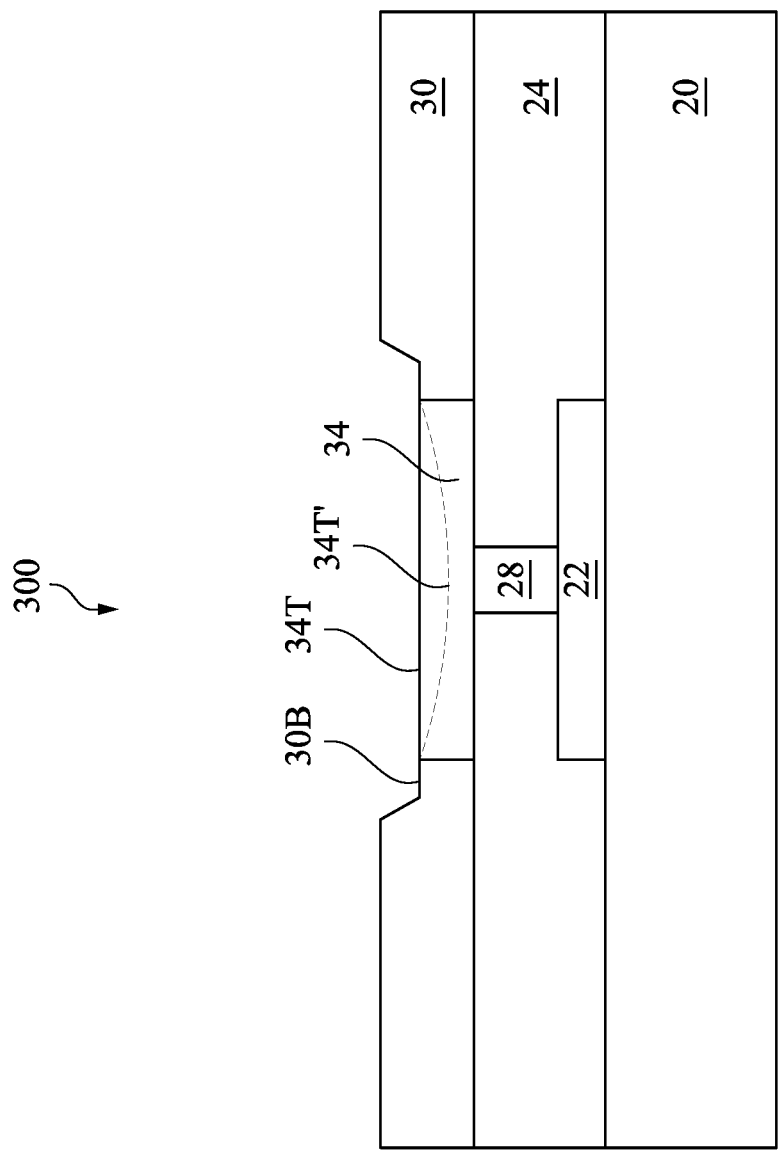

Next, in FIG. 17, the remaining portion of the upper portion 36U (see FIG. 16) is removed. In some embodiments, an etching process, such a wet etch process, is performed to remove the remaining portion of the upper portion 36U. The wet etch process may use an etchant (e.g., HF, HCl, $H_2O_2$, or KOH) that is selective (e.g., having a higher etching rate) to the conductive material 36, such that the conductive material 36 is removed without substantially attacking the IMD layer 30. After the etching process, the remaining portion of the conductive material 36 in the lower portion of the opening 33 form a conductive line 34. The upper surface 34T of the conductive line 34 may be level with the sidewall 30B.

In some embodiments, instead of performing a separate wet etch process, the remaining portion of the upper portion 36U (see FIG. 16) is removed by the CMP process. For example, the slurry used in the CMP process may be selective to the conductive material 36, such that the conductive material 36 is removed at a faster rate than the IMD layer 30. After the CMP process, the remaining portion of the conductive material 36 form the conductive line 34. As illustrated in FIG. 17, due to the dishing effect of the CMP process, the upper surface 34T' (illustrated in phantom) of the conductive line 34 formed by the CMP process may be concave. For simplicity, subsequent figures in the disclosure may not show a concave upper surface 34T' for the conductive line 34, with the understanding that depending on the process used to remove the conductive material 36, the upper surface of the conductive line 34 may be flat (see, e.g., 34T) or concave (see, e.g., 34T').

Figure 18:
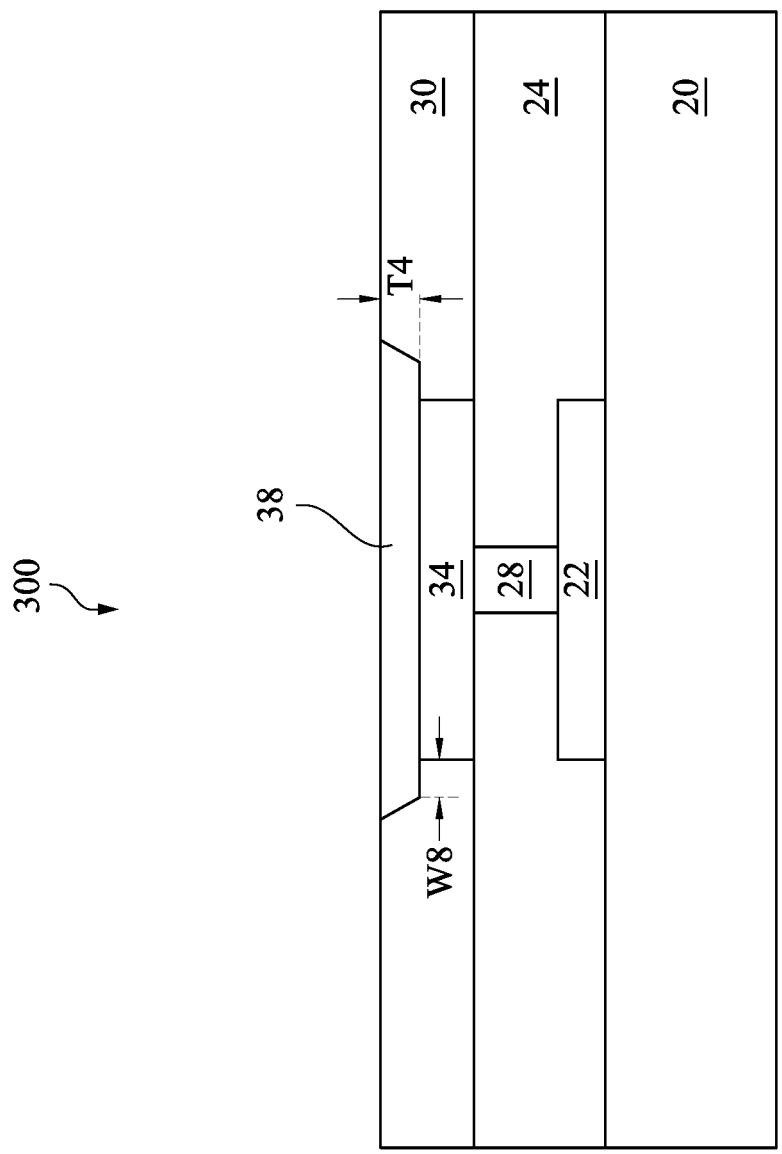

Referring next to FIG. 18, a cap 38 is formed over the conductive line 34 and fills the recess in the IMD layer 30, which recess is formed by the removal of the conductive material 36 (see FIG. 17). In the illustrated embodiment, the cap 38 and the conductive line 34 are formed of different materials. For example, the cap 38 is formed of a conductive material (e.g., electrically conductive material) that is different from the conductive material 36 of the conductive line 34. In an exemplary embodiment, the conductive line 34 is formed of cobalt, and the cap 38 is formed of tungsten (W). Other examples for the material of the cap 38 include Ru, Al, and Cu. In the example of FIG. 18, due to the sloped sidewalls of the recess, the cap 38 also has sloped sidewalls.

The cap 38 may be formed using, e.g., CVD, PVD, plating, or other suitable method. The material of the cap 38 may overfill the recess in the IMD layer 30, in which case a planarization process, such as CMP, may be performed to remove excess portions of the material of the cap 38. In other embodiments, the material of the cap 38 is formed in the recess and fills the recess without overfilling, and therefore, the planarization process is omitted.

In some embodiments, after being formed, a thickness $T_4$ of the cap 38 is between about 5 nm and about 10 nm, and a distance $W_8$ between a sidewall of the cap 38 and a corresponding sidewall of the conductive line 34 is between about 2 nm and about 3 nm, although other dimensions are also possible. As illustrated in FIG. 18, the cap 38 has a width (measured along the direction of $W_8$) larger than a width of the conductive line 34. In some embodiments, the width $W_8$ is between about 1 nm and about 5 nm.

Figure 19:
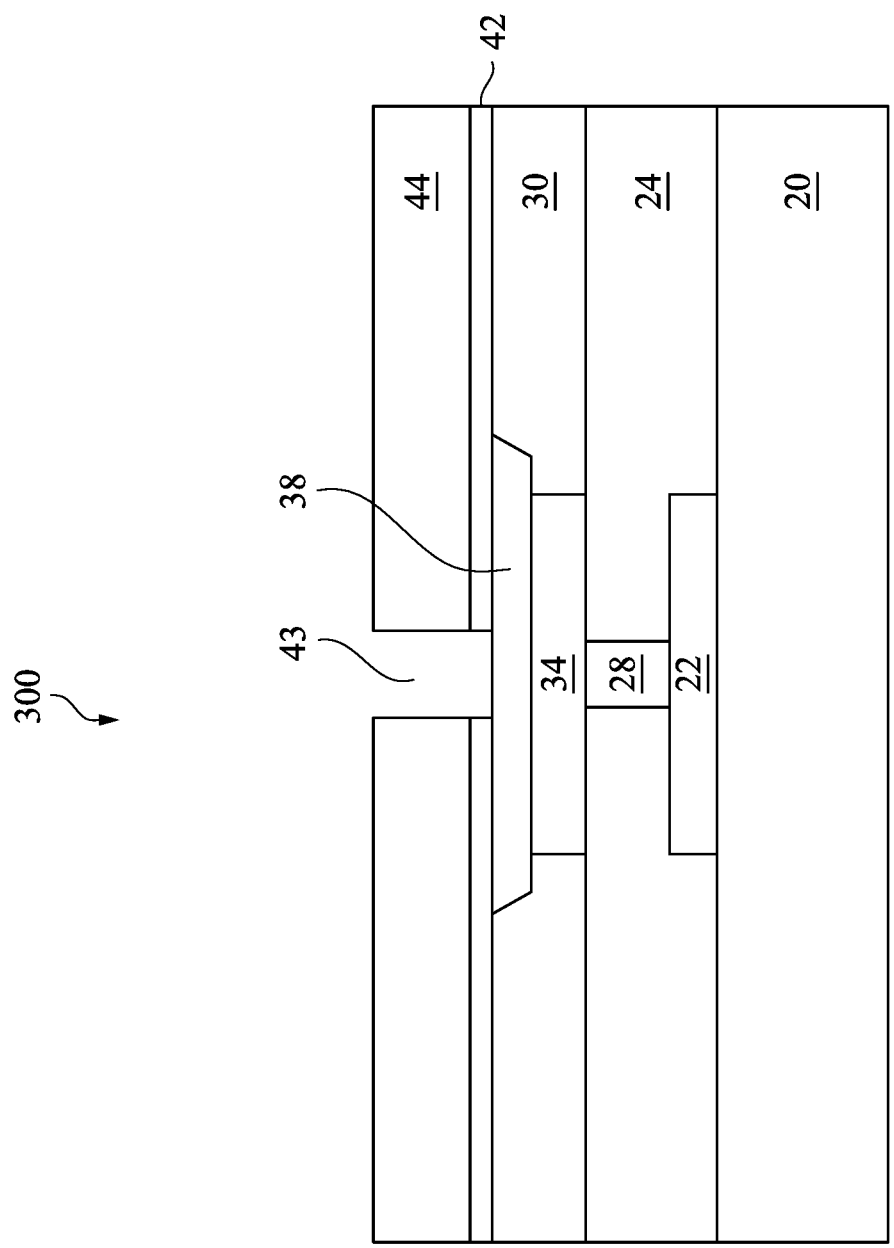

Next, in FIG. 19, an etch stop layer 42 and an IMD layer 44 are formed over the IMD layer 30 and the cap 38. Next, a via opening 43 are formed in the IMD layer 40 using suitable method such as photolithography and etching. The via opening 43 extends through the IMD layer 40 and the etch stop layer 42, and exposes the cap 38. In the example of FIG. 19, the via opening 43 has a width smaller than a width of the cap 38, and therefore, exposes a portion of the upper surface of the cap 38. In other embodiments, the via opening 43 has a width larger than a width of the cap 38, similar to the opening 45 in FIG. 10.

Figure 20A:
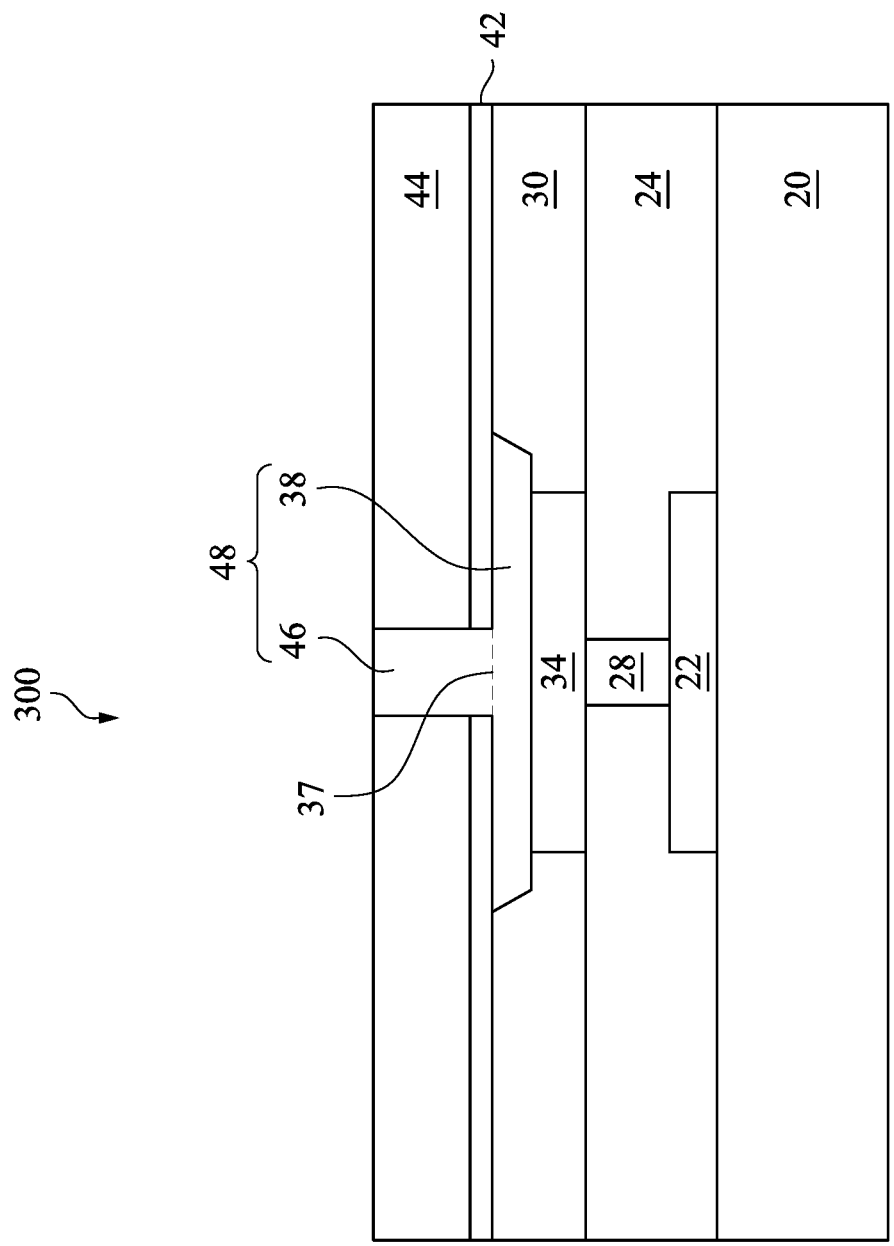

Next, in FIG. 20A, a via 46 is formed in the via opening 43 (see FIG. 19) using the conductive material (e.g., tungsten) of the cap 38. In other words, the via 46 and the cap 38 are formed of a same conductive material. The via 46 is formed directly on (e.g., in direct contact with) the cap 38. Depending on the conductive material and the process used for forming the via 46, there may or may not be an interface 37 between the via 46 and the cap 38. The via 46 and the cap 38 may be collectively referred to as a via 48.

The via 46 may be formed in the via opening 43 using suitable formation method such as CVD, PVD, plating, ALD, the like, or combinations thereof. A planarization process, such as CMP, may be performed to remove excess portions of the material of the via 46 from over the upper surface of the IMD layer 44. In the illustrated embodiment, the via 46 is formed in the via opening 43 and in direct contact with the IMD layer 44 and the etch stop layer 42. In other words, no barrier layer is formed between the via 46 and the IMD layer 44/etch stop layer 42, which may advantageous reduces the RC delay of the semiconductor device 300.

Figure 20B:
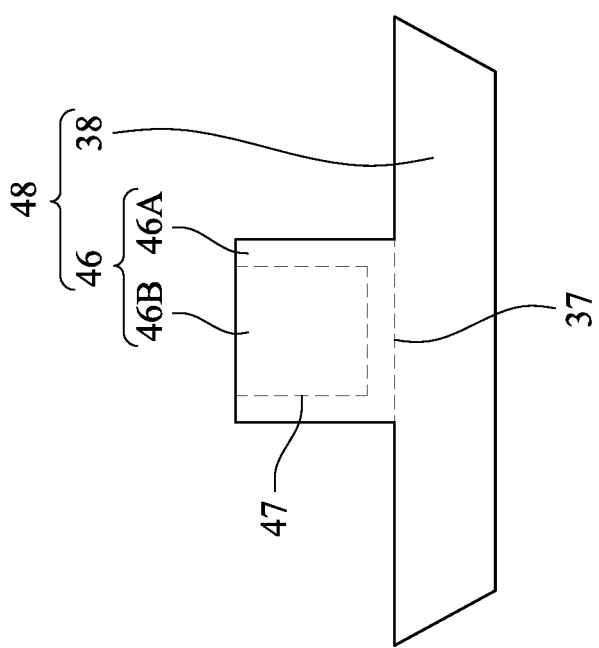

FIG. 20B illustrates a zoomed-in view of the via 48 in FIG. 20A. In some embodiments, when forming the via 46 over the cap 38, two different formation methods are used to form the via 46. In particular, an ALD deposition process is performed to form a first sublayer 46A of the via 46, and a different deposition process, such as CVD, PVD, or plating, is used to fill the rest of the via opening 43 (see FIG. 19) and to form the second sublayer 46B of the via 46. In other words, the first sublayer 46A and the second sublayer 46B are formed of a same material (e.g., tungsten) but using different deposition methods. There may be an interface 47 between the first sublayer 46A and the second sublayer 46B. Since the first sublayer 46A is formed by ALD, its density is higher than the second sublayer 46B. In some embodiments, having the first sublayer 46A with a higher quality (e.g., higher density) reduces the resistance of the via 46 formed. Since the deposition rate of the ALD deposition process may be lower than that of, e.g., PVD, CVD, or plating, forming the second sublayer 46B by PVD, CVD, or plating may advantageously reduce the manufacturing time, thus allowing for a balance to be achieved between reducing resistance (e.g., RC delay) of the via 46 and reducing the manufacturing time.

Still referring to FIG. 20B, in some embodiments, the overall density (e.g., average density) of the via 46 is higher than that of the cap 38, because the via 46 has the first sublayer 46A formed of ALD (e.g., a higher density material), and the cap 38 is formed by CVD, PVD, or plating (e.g., a lower density material). In other embodiments, the via 46 does not have a plurality of sublayers, and instead, the via 46 is formed using a single deposition process such as CVD, PVD, plating, or the like, in which case the via 46 and the cap 38 may have a same density.

Figure 21:
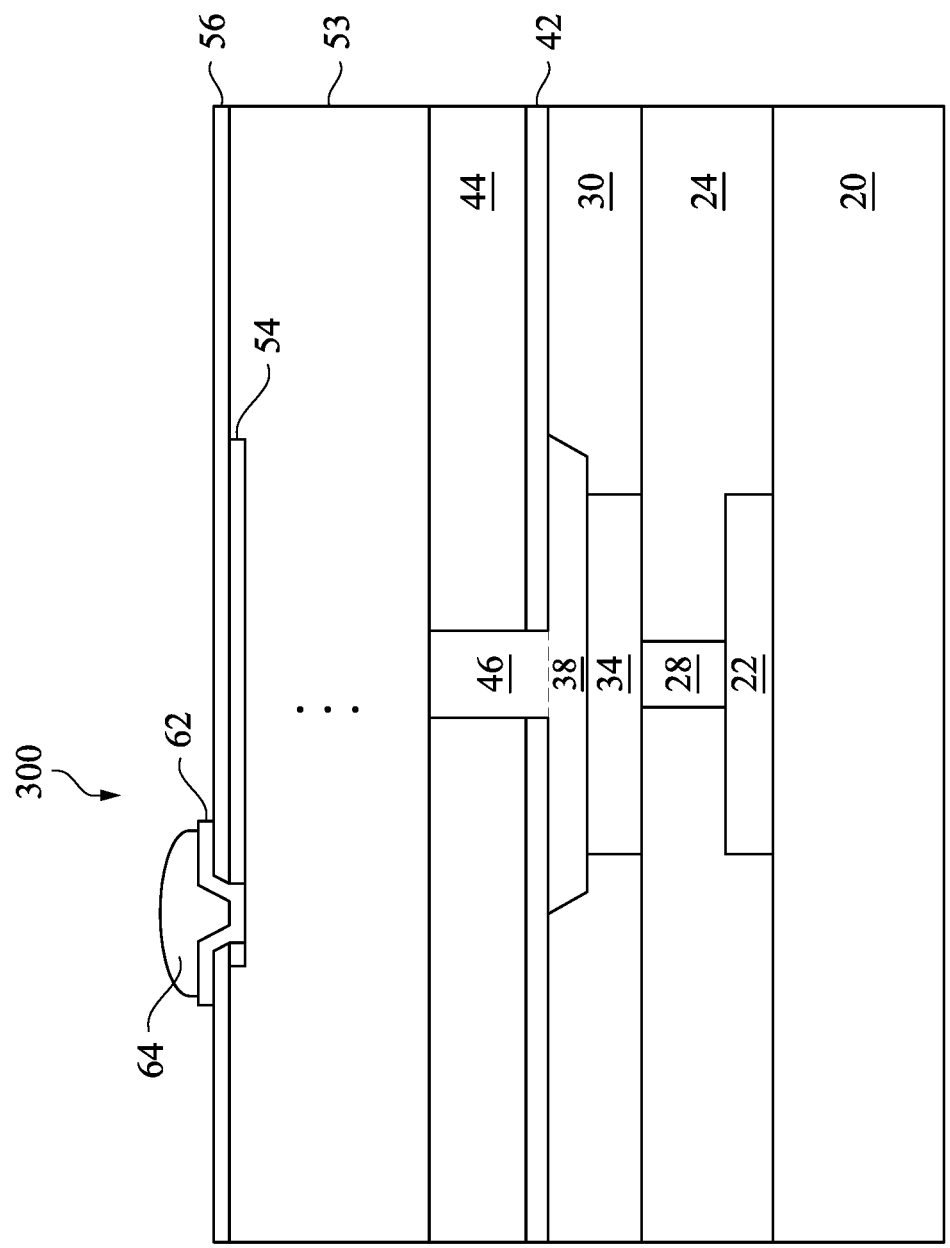

Next, in FIG. 21, one or more IMD layers 53 comprising conductive features (e.g., conductive lines and vias) are formed over the IMD layer 44, using method same as or similar to those discussed above for forming the IMD layer (e.g., 30, or 44) and the conductive features (e.g., 34, 38, 46). Next, a passivation layer 56, such as a polymer layer, is formed over the IMD layer 53. After the passivation layer 56 is formed, an under bump metallurgy (UBM) structure 62 is formed over the passivation layer 56 and is electrically coupled to a conductive feature 54 (e.g., a conductive line) of the IMD layer 53. Next, an external connector 64 is formed on the UBM structure 62. Formation of the UBM structure 62 and the external connector 64 may be the same or similar as those described above with reference to FIG. 9, thus details are not repeated.

Variations to the disclosed embodiments are possible and are fully intended to be included in the present disclosure. For example, although the cap 38 is illustrated to be formed under the via 46 and in the IMD layers (e.g., 44, 53), the cap 38 may also be formed under the contact plug 28 and in the ILD 24. Since the contact plug 28 is connected to an underlying conductive feature (e.g., the gate electrode of a transistor, or the source/drain region of a transistor), the principle of the disclosure may also be applied to form a cap 38 between the contact plug 28 and the conductive feature of the integrated circuit devices 22. In other words, by forming a cap 38 using a material different from the material of the conductive feature of the integrated circuit devices 22, erosion of the conductive feature of the integrated circuit devices 22 may be prevented or reduced. As another example, the profile of the cap 38, e.g., the shapes of the sidewalls of the cap 38, may be modified to have other shapes, and the benefit of the cap 38 still holds, e.g., when the cap 38 is wider than the underlying conductive line (e.g., 34). These and other modifications are fully intended to be included within the scope of the present disclosure.

Embodiments may achieve advantages. The cap 38 shields the conductive line 34 from the slurry used in a subsequent CMP process, therefore, erosion of the conductive line 34 is prevented or reduced, which increases the performance of the device formed and improves production yield. By using two different materials for the cap 38 and the conductive line 34, the etching selectivity between these two different materials can be exploited to reduce or prevent erosion of the conductive line 34. The present disclosure allows for vias 46 to be formed without a barrier layer, which advantageously reduces the RC delay of the device formed.

Figure 22:
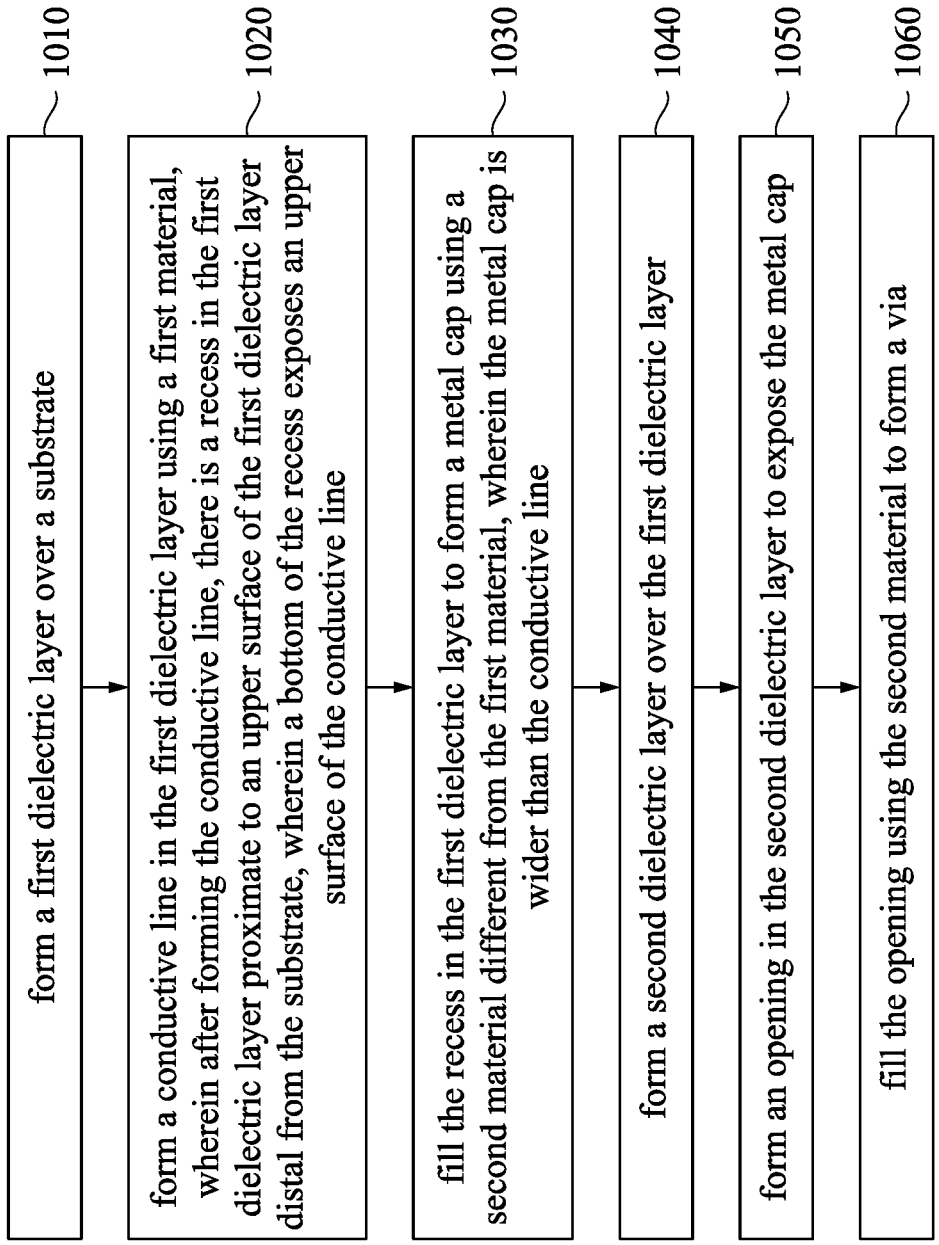
FIG. 22 illustrates a flow chart of a method for forming a semiconductor device, in some embodiments.

FIG. 22 illustrates a flow chart of a method for forming a semiconductor device, in accordance with some embodiments. It should be understood that the embodiment method shown in FIG. 22 is merely an example of many possible embodiment methods. One of ordinary skill in the art would recognize many variations, alternatives, and modifications. For example, various steps as illustrated in FIG. 22 may be added, removed, replaced, rearranged and repeated.

Referring to FIG. 22, in block 1010, a first dielectric layer is formed over a substrate. In block 1020, a conductive line is formed in the first dielectric layer using a first material, wherein after forming the conductive line, there is a recess in the first dielectric layer proximate to an upper surface of the first dielectric layer distal from the substrate, wherein a bottom of the recess exposes an upper surface of the conductive line. In block 1030, the recess in the first dielectric layer is filled to form a metal cap using a second material different from the first material, wherein the metal cap is wider than the conductive line. In block 1040, a second dielectric layer is formed over the first dielectric layer. In block 1050, an opening is formed in the second dielectric layer to expose the metal cap. In block 1060, the opening is filled using the second material to form a via.

In an embodiment, a semiconductor device includes a first dielectric layer over a substrate, the first dielectric layer including a first dielectric material extending from a first side of the first dielectric layer distal from the substrate to a second side of the first dielectric layer opposing the first side; a second dielectric layer over the first dielectric layer; a conductive line in the first dielectric layer, the conductive line including a first conductive material, an upper surface of the conductive line being closer to the substrate than an upper surface of the first dielectric layer; a metal cap in the first dielectric layer, the metal cap being over and physically connected to the conductive line, the metal cap including a second conductive material different from the first conductive material; and a via in the second dielectric layer and physically connected to the metal cap, the via including the second conductive material. In an embodiment, an upper surface of the metal cap is level with the upper surface of the first dielectric layer. In an embodiment, the metal cap is wider than the conductive line. In an embodiment, the metal cap has sidewalls that are perpendicular to the upper surface of the conductive line. In an embodiment, the metal cap has sidewalls that are slanted with respect to the upper surface of the conductive line. In an embodiment, the first conductive material is cobalt, and the second conductive material is tungsten. In an embodiment, the via is wider than the metal cap. In an embodiment, the semiconductor device further includes an etch stop layer between the first dielectric layer and the second dielectric layer, where the via extends through the etch stop layer. In an embodiment, the via physically contacts the second dielectric layer. In an embodiment, the semiconductor device further includes a barrier layer between the conductive line and the first dielectric layer.

In an embodiment, a semiconductor device includes a substrate; a first dielectric layer over the substrate, the first dielectric layer being a single layer; a conductive feature in the first dielectric layer, the conductive feature including a first conductive material, a first surface of the conductive feature distal from the substrate being closer to the substrate than a first surface of the first dielectric layer distal from the substrate; a second dielectric layer over the first dielectric layer and the conductive feature; and a conductive plug having an upper portion and a lower portion, the upper portion and the lower portion including a second conductive material different from the first conductive material, the upper portion of the conductive plug disposed in the second dielectric layer, the lower portion of the conductive plug extending into the first dielectric layer and being physically connected to the conductive feature. In an embodiment, the lower portion of the conductive plug has a width larger than a width of the conductive feature. In an embodiment, the conductive plug is in physical contact with the second dielectric layer. In an embodiment, the semiconductor device further includes a barrier layer between the conductive feature and the first dielectric layer. In an embodiment, the upper portion of the conductive plug has a first density that is higher than a second density of the lower portion of the conductive plug.

In an embodiment, a method of forming a semiconductor device includes forming a first dielectric layer over a substrate; forming a conductive line in the first dielectric layer using a first material, where after forming the conductive line, there is a recess in the first dielectric layer proximate to an upper surface of the first dielectric layer distal from the substrate, where a bottom of the recess exposes an upper surface of the conductive line; filling the recess in the first dielectric layer to form a metal cap using a second material different from the first material, where the metal cap is wider than the conductive line; forming a second dielectric layer over the first dielectric layer; forming an opening in the second dielectric layer to expose the metal cap; and filling the opening using the second material to form a via. In an embodiment, forming the conductive line includes forming a through hole in the first dielectric layer, the through hole having an upper portion proximate to the upper surface of the first dielectric layer and a lower portion underlying the upper portion, the upper portion of the through hole being wider than the lower portion of the through hole; filling the through hole with the first material, a first portion of the first material filling the upper portion of the through hole, and a second portion of the first material filling the lower portion of the through hole; reducing a height of the first portion of the first material and a height of the first dielectric layer; and after the reducing, removing remaining portions of the first portion of the first material to form the recess in the first dielectric layer, where the second portion of the first material forms the conductive line after the removing. In an embodiment, filling the opening includes depositing a first sublayer including the second material in the opening using atomic layer deposition (ALD); and depositing a second sublayer including the second material over the first sublayer in the opening using a deposition method other than ALD. In an embodiment, the opening is formed to be wider than the metal cap. In an embodiment, the first material is cobalt, and the second material is tungsten.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
a first dielectric layer over a substrate, the first dielectric layer comprising a first dielectric material extending from an upper surface of the first dielectric layer distal from the substrate to a lower surface of the first dielectric layer opposing the upper surface;
a second dielectric layer over the first dielectric layer;
a conductive line in the first dielectric layer, the conductive line comprising a first conductive material, an upper surface of the conductive line being closer to the substrate than the upper surface of the first dielectric layer;
a metal cap in the first dielectric layer, the metal cap being over and physically connected to the conductive line, the metal cap comprising a second conductive material different from the first conductive material, wherein a first width of the metal cap, measured between opposing sidewalls of the metal cap along a first direction parallel to a major upper surface of the substrate, is larger than a second width of the conductive line measured between opposing sidewalls of the conductive line along the first direction; and
a via in the second dielectric layer and physically connected to the metal cap, the via comprising the second conductive material.

2. The semiconductor device of claim 1, wherein an upper surface of the metal cap is level with the upper surface of the first dielectric layer.

3. The semiconductor device of claim 1, wherein the sidewalls of the metal cap are perpendicular to the upper surface of the conductive line.

4. The semiconductor device of claim 1, wherein the sidewalls of the metal cap are slanted with respect to the upper surface of the conductive line.

5. The semiconductor device of claim 1, wherein the first conductive material is cobalt, and the second conductive material is tungsten.

6. The semiconductor device of claim 1, wherein a third width of the via, measured between opposing sidewalls of the via along the first direction, is larger than the first width of the metal cap.

7. The semiconductor device of claim 1, further comprising an etch stop layer between the first dielectric layer and the second dielectric layer, wherein the via extends through the etch stop layer.

8. The semiconductor device of claim 1, wherein the via physically contacts the second dielectric layer.

9. The semiconductor device of claim 8, further comprising a barrier layer between the conductive line and the first dielectric layer.

10. A semiconductor device comprising:
a substrate;
a first dielectric layer over the substrate, the first dielectric layer being a single layer;
a conductive feature in the first dielectric layer, the conductive feature comprising a first conductive material, a first surface of the conductive feature distal from the substrate being closer to the substrate than a first surface of the first dielectric layer distal from the substrate;
a second dielectric layer over the first dielectric layer and the conductive feature; and
a conductive plug having an upper portion and a lower portion, the upper portion and the lower portion comprising a second conductive material different from the first conductive material, the upper portion of the conductive plug disposed in the second dielectric layer, the lower portion of the conductive plug extending into the first dielectric layer and being physically connected to the conductive feature, the second conductive material extending continuously without an interface from an upper surface of the upper portion distal from the substrate to a lower surface of the lower portion contacting the conductive feature.

11. The semiconductor device of claim 10, wherein the lower surface of the lower portion of the conductive plug covers the entire first surface of the conductive feature.

12. The semiconductor device of claim 11, wherein the conductive plug is in physical contact with the second dielectric layer.

13. The semiconductor device of claim 12, further comprising a barrier layer between the conductive feature and the first dielectric layer.

14. The semiconductor device of claim 11, wherein the upper portion of the conductive plug has a first volumetric mass density that is higher than a second volumetric mass density of the lower portion of the conductive plug.

15. A semiconductor device comprising:
a first dielectric layer over a substrate, the first dielectric layer comprising a first dielectric material that extends continuously without an interface from an upper surface of the first dielectric layer distal from the substrate to a lower surface of the first dielectric layer facing the substrate;
a second dielectric layer over the first dielectric layer;
a conductive line in the first dielectric layer, the conductive line comprising a first conductive material, an upper surface of the conductive line distal from the substrate being disposed between the upper surface of the first dielectric layer and the lower surface of the first dielectric layer;
a metal cap in the first dielectric layer and over the conductive line, the metal cap comprising a second conductive material different from the first conductive material, an upper surface of the metal cap distal from the substrate being level with the upper surface of the first dielectric layer, the conductive line being disposed within lateral extents of the metal cap; and
a via in the second dielectric layer and physically connected to the metal cap, the via comprising the second conductive material.

16. The semiconductor device of claim 15, wherein a lower surface of the metal cap facing the substrate physically contacts the conductive line.

17. The semiconductor device of claim 15, further comprising a barrier layer extending along sidewalls of the conductive line between the conductive line and the first dielectric layer, wherein there is no barrier layer along sidewalls of the metal cap between the metal cap and the first dielectric layer.

18. The semiconductor device of claim 15, wherein a first material density of the via is higher than a second material density of the metal cap.

19. The semiconductor device of claim 15, wherein the second conductive material extends continuously without an interface from an upper surface of the via distal from the substrate to a lower surface of the metal cap contacting the conductive line.

20. The semiconductor device of claim 1, wherein the via has an inner portion and an outer portion around the inner portion, the outer portion in physical contact with the second dielectric layer, wherein the outer portion of the via and the inner portion of the via comprise the second conductive material, and a first material density of the outer portion is higher than a second material density of the inner portion.

* * * * *